US011522261B2

United States Patent
Byun et al.

(10) Patent No.: US 11,522,261 B2
(45) Date of Patent: Dec. 6, 2022

(54) MULTI-MODE TRANSMISSION LINE AND STORAGE DEVICE INCLUDING THE SAME

(71) Applicant: SAMSUNG ELECTRONICS CO., LTD., Suwon-si (KR)

(72) Inventors: Jindo Byun, Suwon-si (KR); Seonkyoo Lee, Hwaseong-si (KR); Hyunjin Kim, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 369 days.

(21) Appl. No.: 16/730,277

(22) Filed: Dec. 30, 2019

(65) Prior Publication Data
US 2020/0220244 A1    Jul. 9, 2020

(30) Foreign Application Priority Data
Jan. 7, 2019  (KR) .................. 10-2019-0001946

(51) Int. Cl.
*H01P 3/16*  (2006.01)
*H01P 3/08*  (2006.01)
(Continued)

(52) U.S. Cl.
CPC .............. *H01P 3/081* (2013.01); *G11C 16/10* (2013.01); *H01L 23/5384* (2013.01); *H01P 1/2002* (2013.01)

(58) Field of Classification Search
CPC .. H01P 3/081; H01P 3/16; H01P 3/122; H01P 3/08; H01P 3/085; H01P 1/2002;
(Continued)

(56) References Cited

U.S. PATENT DOCUMENTS 6,438,014 B2    8/2002  Funaba et al.
6,803,252 B2   10/2004  Lao et al.
(Continued)

FOREIGN PATENT DOCUMENTS

CN    101090170 A    12/2007
CN    101615711 A    12/2009
(Continued)

OTHER PUBLICATIONS

Communication dated Oct. 28, 2021, issued by the India Intellectual Property Office in Indian Patent Application No. 201944023201.
(Continued)

*Primary Examiner* — Stephen E. Jones
(74) *Attorney, Agent, or Firm* — Sughrue Mion, PLLC

(57) ABSTRACT

A multi-mode transmission line includes a first and second conductive layers, first and second waveguide walls, a strip line, and a blind conductor. The second conductive layer that is formed over the first conductive layer. The first waveguide wall is elongated in a first direction and is in contact with the first conductive layer and the second conductive layer in a vertical direction. The second waveguide wall is elongated in the first direction parallel to the first waveguide wall and is in contact with the first conductive layer and the second conductive layer in the vertical direction. The strip line is formed between the first and second conductive layers and between the first and second waveguide walls. The blind conductor is connected to one of the first conductive layer, the second conductive layer, the first waveguide wall, or the second waveguide wall.

20 Claims, 23 Drawing Sheets

(51) Int. Cl.
  *H01L 23/538* (2006.01)
  *G11C 16/10* (2006.01)
  *H01P 1/20* (2006.01)
(58) Field of Classification Search
  CPC .......... H01P 1/207; H01P 1/2088; H01P 1/20;
  H01P 1/201; H01P 7/10; H01P 7/105;
  H01L 23/5384; G11C 16/10
  See application file for complete search history.

(56) References Cited

U.S. PATENT DOCUMENTS

| | | | |
|---|---|---|---|
| 7,227,428 | B2 | 6/2007 | Fukunaga |
| 9,059,492 | B2 | 6/2015 | Morita et al. |
| 9,088,060 | B2 | 7/2015 | Robin et al. |
| 9,240,619 | B2 | 1/2016 | Howard et al. |
| 9,531,085 | B2 | 12/2016 | Miraftab et al. |
| 9,755,290 | B2 | 9/2017 | Xue et al. |
| 9,935,352 | B2 | 4/2018 | Yosui et al. |
| 2004/0201971 | A1* | 10/2004 | Fessler ................ H05K 1/0218 174/262 |
| 2009/0220240 | A1 | 9/2009 | Abhari et al. |
| 2018/0217949 | A1 | 8/2018 | Oster et al. |
| 2019/0305396 | A1* | 10/2019 | Dogiamis ................ H01P 5/10 |

FOREIGN PATENT DOCUMENTS

| | | |
|---|---|---|
| CN | 105226359 A | 1/2016 |
| CN | 106537684 A | 3/2017 |
| CN | 108777343 A | 11/2018 |
| JP | 10-261841 A | 9/1998 |
| JP | 11-340701 A | 12/1999 |
| JP | 3732952 B2 | 1/2006 |
| KR | 10-1892866 B1 | 8/2018 |

OTHER PUBLICATIONS

Tomassoni, et al., "Substrate Integrated Waveguide Cavity Filters: Miniaturization and New Materials for IoT Applications", 2017, RADIOENGINEERING, vol. 26, No. 3, 9 pages total.

Suntives, Asanee et al., "Ultra-High-Speed Multichannel Data Transmission Using Hybrid Substrate Integrated Waveguides", IEEE Transactions on Microwave Theory and Techniques, vol. 56, No. 8, Aug. 2008, pp. 1973-1984. (12 pages total).

Bensalem, Brahim et al., "A New High-Speed Memory Interconnect Architecture Using Microwave Interconnects and Muticarrier Signaling", IEE Transactions on Components, Packaging and Manufacturing Technology, vol. 4, No. 2, Feb. 2014, pp. 332-340. (9 pages total).

* cited by examiner

FIG. 13
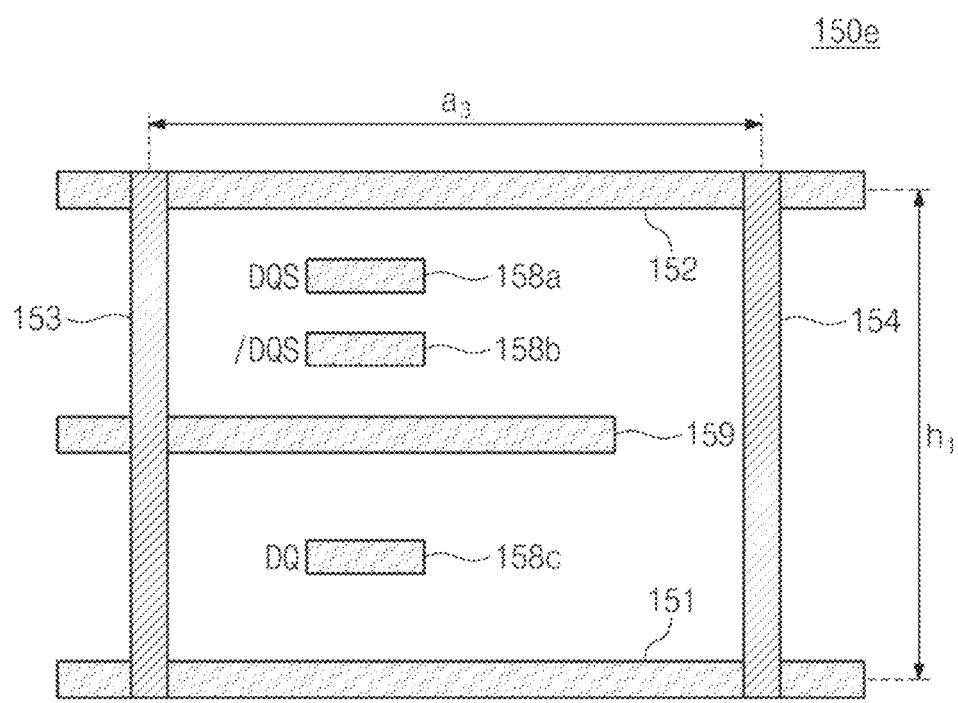
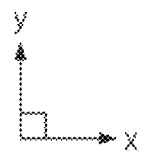

FIG. 15
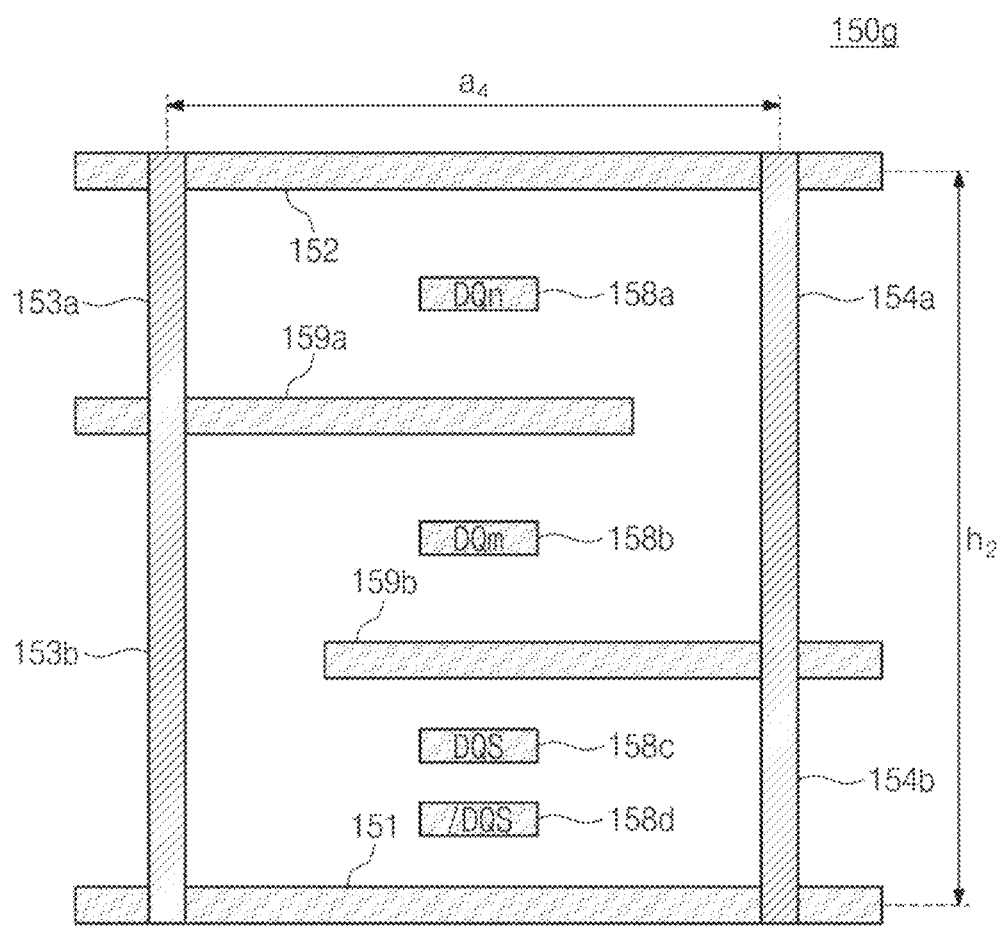
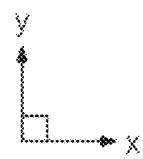

MULTI-MODE TRANSMISSION LINE AND STORAGE DEVICE INCLUDING THE SAME

CROSS-REFERENCE TO RELATED APPLICATIONS

This application claims priority under 35 U.S.C. § 119 from Korean Patent Application No. 10-2019-0001946 filed on Jan. 7, 2019, in the Korean Intellectual Property Office, the disclosure of which is incorporated by reference herein in its entirety.

BACKGROUND

1. Field

Apparatuses, devices, and articles of manufacture consistent with the present disclosure relate to a semiconductor device, and more particularly, relate to a multi-mode transmission line and a storage device including the same.

2. Description of the Related Art

There is an increasing demand for a high-performance semiconductor device having low power consumption and a high bandwidth. Various interface manners are being developed to implement a low-power, high-bandwidth memory device. For example, a multiplexing technology using a radio frequency (RF) signal may be used for chip-to-chip data transmission. A substrate integrated waveguide SIW that is appropriate to transmit an RF signal may be used for the multiplexing.

The substrate integrated waveguide SIW may be implemented with a multi-mode transmission line by using a strip line together. Low loss and a broad bandwidth of the interface are possible through the implementation of the multi-mode transmission line. However, a frequency of a signal transmitted through the substrate integrated waveguide SIW is inversely proportional to a width of a waveguide. Accordingly, the width of the substrate integrated waveguide SIW may have to be relatively large for the purpose of transmitting a signal through the substrate integrated waveguide SIW in an operating frequency band of a system in which a semiconductor device is included. The width requirement conflicts with a requirement on a lightweight, small-sized semiconductor device through the reduction of area. In addition, it is necessary to solve the coupling or interference between strip lines in the multi-mode transmission line.

SUMMARY

It is an aspect to provide a transmission line that may suppress a crosstalk between strip lines in a multi-mode transmission line using a substrate integrated waveguide SIW and a strip line and that may decrease an operating frequency of a waveguide and a storage device including the same.

According to an aspect of an exemplary embodiment, there is provided a multi-mode transmission line that includes a first conductive layer; a second conductive layer formed over the first conductive layer; a first waveguide wall elongated in a first direction and being in contact with the first conductive layer and the second conductive layer in a vertical direction; a second waveguide wall elongated in the first direction in parallel to the first waveguide wall and being in contact with the first conductive layer and the second conductive layer in the vertical direction; at least one strip line formed between the first conductive layer and the second conductive layer and between the first waveguide wall and the second waveguide wall; and a blind conductor connected to one of the first conductive layer, the second conductive layer, the first waveguide wall, or the second waveguide wall.

According to another aspect of an exemplary embodiment, there is provided a multi-mode transmission line that includes a substrate; a substrate integrated waveguide including a plurality of through vias that are arranged in at least two columns within the substrate, each column forming a waveguide wall, and pass through an upper conductive layer and a lower conductive layer in a vertical direction; and at least one strip line elongated within the substrate integrated waveguide in a propagation direction of the substrate integrated waveguide, wherein the substrate integrated waveguide includes the lower conductive layer, the upper conductive layer, and a blind conductor, and wherein the blind conductor is in contact with at least one of the waveguide walls and is elongated to an inside of the substrate integrated waveguide.

According to yet another aspect of an exemplary embodiment, there is provided a storage device that includes a nonvolatile memory device; a storage controller configured to communicate with the nonvolatile memory device in a multi-mode; and a multi-mode transmission line configured to transmit a signal in the multi-mode between the storage controller and the nonvolatile memory device, wherein the multi-mode transmission line includes a substrate integrated waveguide including a plurality of through vias that are arranged in at least two columns, each column forming a waveguide wall, and pass through an upper conductive layer and a lower conductive layer in a vertical direction; and at least one strip line elongated within the substrate integrated waveguide in a propagation direction of the substrate integrated waveguide, wherein the substrate integrated waveguide includes the lower conductive layer, the upper conductive layer, and a blind conductor, and wherein the blind conductor is in contact with at least one of the waveguide walls and is elongated to an inside of the substrate integrated waveguide.

According to another aspect of an exemplary embodiment, there is provided a multi-mode transmission line that includes a first conductive layer, a second conductive layer, a first waveguide wall, and a second waveguide wall defining a volumetric space; at least one strip line formed in the volumetric space; and a blind conductor connected to one of the first conductive layer, the second conductive layer, the first waveguide wall, or the second waveguide wall.

BRIEF DESCRIPTION OF THE FIGURES

The above and other aspects will become apparent by describing in detail exemplary embodiments thereof with reference to the accompanying drawings.

FIG. 13 is a cross-sectional view illustrating a multi-mode transmission line according to yet another exemplary embodiment;

FIG. 15 is a cross-sectional view illustrating a multi-mode transmission line according to yet another exemplary embodiment;

DETAILED DESCRIPTION

Figure 1:
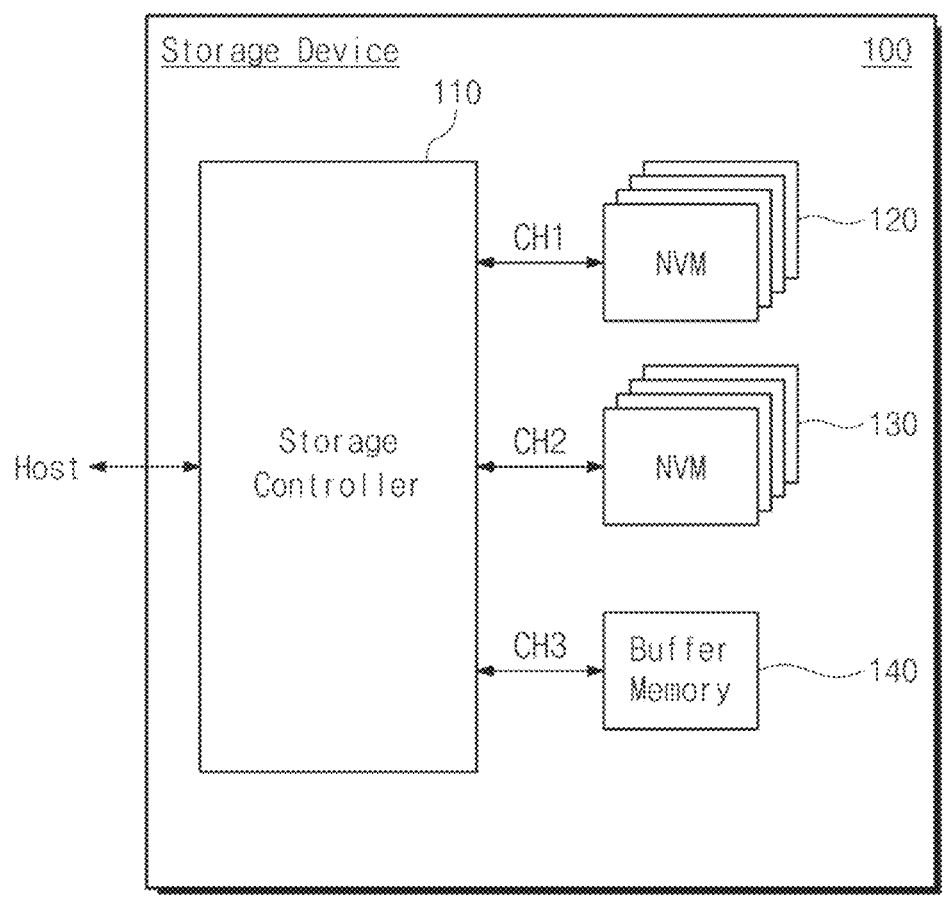
FIG. 1 is a block diagram illustrating a storage device according to an exemplary embodiment.

It should be understood that both the foregoing general description and the following detailed description are provided as examples, and it should be regarded as an additional description is provided. Reference numerals will be represented in detail in embodiments, examples of which are illustrated in the accompanying drawings. Wherever possible, the same reference numerals are used in the drawings and the description to refer to the same or similar parts.

Below, a nonvolatile memory device or a storage device may be used as an example of a semiconductor device including a wide I/O interface. However, one skilled in the art may easily understand other merits and performance depending on the contents disclosed here. The inventive concept may be implemented or applied through other embodiments. In addition, the detailed description may be changed or modified according to view points and applications without departing from the claims, the scope and spirit, and any other purposes disclosed herein.

FIG. 1 is a block diagram illustrating a storage device according to an exemplary embodiment. Referring to FIG. 1, a storage device 100 includes a storage controller 110 for providing interfacing with a host, a plurality of nonvolatile memory devices (NVM) 120 and 130, and a buffer memory 140. Channels CH1 and CH2 for exchanging data may be provided between the storage controller 110 and the plurality of nonvolatile memory devices (NVM) 120 and 130. In addition, a channel CH3 for transmitting buffering data is provided between the storage controller 110 and the buffer memory 140.

The storage controller 110 may be configured to control the plurality of nonvolatile memory devices (NVM) 120 and 130. For example, the storage controller 110 writes data in the plurality of nonvolatile memory devices (NVM) 120 and 130 based on a request of the outside or a host. The storage controller 110 may read data stored in the plurality of nonvolatile memory devices (NVM) 120 and 130 based on a request of the outside or the host. The storage controller 110 may provide the plurality of nonvolatile memory devices (NVM) 120 and 130 with a command, an address, and a control signal for the purpose of accessing the plurality of nonvolatile memory devices (NVM) 120 and 130. The storage controller 110 may access the plurality of nonvolatile memory devices (NVM) 120 and 130 for the purpose of reading or writing data that the host requests.

In particular, the nonvolatile memory devices (NVM) 120 may exchange data with the storage controller 110 through the first channel CH1 that is implemented with a multi-mode transmission line according to exemplary embodiments. The nonvolatile memory devices (NVM) 130 may exchange data with the storage controller 110 through the second channel CH2. The second channel CH2 may also be implemented with the multi-mode transmission line that may transmit a signal in the RF band and a signal in a baseband independently. The first channel CH1 or the second channel CH2 may include a substrate integrated waveguide SIW that transmits a multiplexed signal in the RF band between the storage controller 110 and at least a part of the nonvolatile memory devices (NVM) 120 and 130. In addition, the first channel CH1 or the second channel CH2 may include a strip line that transmits a signal between the storage controller 110 and at least a part of the nonvolatile memory devices (NVM) 120 and 130.

The buffer memory 140 may exchange data with the storage controller 110 through the third channel CH3. The third channel CH3 may also be implemented with the multi-mode transmission line for supporting the wide I/O interface.

Here, it may be understood that in some exemplary embodiments only a part of the first to third channels CH1 to CH3 is formed of the multi-mode transmission line for implementing the wide I/O interface. In addition, each of the first channel CH1 and the second channel CH2 may be implemented with separated substrate integrated waveguides SIW. Alternatively, the first channel CH1 and the second channel CH2 may be implemented with the multi-mode transmission line that includes one substrate integrated waveguide SIW and a plurality of strip lines arranged in the unit of a channel. The multi-mode transmission line may include a blind conductor that shields strip lines. That is, the strip lines may be formed with the blind conductor interposed therebetween. Examples of implementing the multi-mode transmission line will be described in detail with reference to the accompanying drawings.

The storage device 100 that uses the multi-mode transmission line according to exemplary embodiments may make an operating frequency band of the substrate integrated waveguide SIW low, while using the small area. In addition, a crosstalk or interference occurring between strip lines may be suppressed by effectively providing a shielding between the strip lines.

Figure 2:
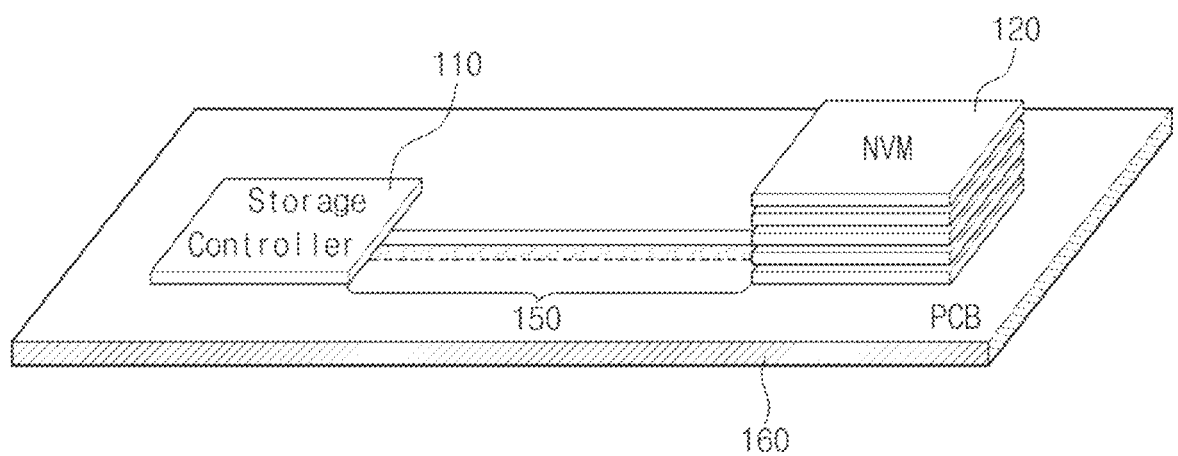
FIG. 2 is a three-dimensional view of a multi-mode transmission line connecting a storage controller and nonvolatile memory devices of the storage device illustrated in FIG. 1, according to an exemplary embodiment.

FIG. 2 is a three-dimensional view of a multi-mode transmission line connecting a storage controller and nonvolatile memory devices illustrated in FIG. 1, according to exemplary embodiments. Referring to FIG. 2, the storage controller 110 and the nonvolatile memory devices (NVM) 120 may exchange data through a multi-mode transmission line 150 that is formed in a PCB substrate 160.

The storage controller 110 may communicate with the nonvolatile memory devices (NVM) 120 through the multi-mode transmission line 150. The nonvolatile memory devices (NVM) 120 may be composed of a plurality of stacked nonvolatile memory chips that are connected by using a through-silicon via TSV. Each nonvolatile memory chip may exchange data with the storage controller 110 through a substrate integrated waveguide SIW or a strip line included in the multi-mode transmission line 150.

The multi-mode transmission line 150 may be formed within the PCB substrate 160. For example, the multi-mode transmission line 150 may include the substrate integrated waveguide SIW, which is formed by using a plurality of vias connecting a lower conductive layer and an upper conductive layer, and at least one strip line elongated within the substrate integrated waveguide SIW in a z-direction. The lower conductive layer and the upper conductive layer of the substrate integrated waveguide SIW according to exemplary embodiments may be formed of a metal thin film. The plurality of vias for forming the substrate integrated waveguide SIW may be arranged in the z-direction at regular intervals. Here, it may be understood that vias for forming a waveguide wall may be implemented with a metal wall in some exemplary embodiments.

In particular, the substrate integrated waveguide SIW according to an exemplary embodiment may include a blind conductor for increasing an effective width (i.e., an effective width in an x-direction) of the waveguide. The blind conductor may be formed in the same direction as the vias but may be formed to be shorter than a length of a via. Alternatively, the blind conductor may be formed of a blind conductive layer that protrudes from the waveguide wall of the substrate integrated waveguide SIW to the inside of the waveguide. In some exemplary embodiments, the blind conductor may include a plurality of blind vias. Here, the blind vias may be arranged at the same interval as through vias for forming a waveguide wall(s). However, the blind vias are connected to one of the upper conductive layer or the lower conductive layer. That is, the blind vias do not extend all the way from the lower conductive layer to the upper conductive layer, but rather the blind vias may be connected to only the upper conductive layer, or the blind vias may be connected to only the lower conductive layer, as described further below. Since a structure of the substrate integrated waveguide SIW including the above-described blind vias allows an effective width to increase, in the below description, the substrate integrated waveguide SIW may be referred to as a "folded substrate integrated waveguide FSIW". In addition, the blind vias may electromagnetically shield or separate strip lines formed within the substrate integrated waveguide SIW.

The effective width of the waveguide may be increased by at least one blind via or at least one blind conductive layer formed in the folded substrate integrated waveguide FSIW. In the case where the effective width of the waveguide increases, an operating frequency of a signal in the RF band that is transmitted through the substrate integrated waveguide SIW may be decreased. Because the operating frequency of the folded substrate integrated waveguide FSIW may be decreased through the blind conductor, an actual width of the substrate integrated waveguide SIW may be reduced as much as the decrement of the operating frequency. That is, as the width or size of the multi-mode transmission line 150 is reduced, it may be possible to implement a smaller-sized or wideband device more easily. Also, the coupling or interference occurring between strip lines may be effectively blocked through a plurality of blind conductors, thus making a signal to noise ratio (SNR) of a transmit signal higher.

Here, a cross-sectional structure of the multi-mode transmission line 150 may be provided in the form of a rectangle, but the exemplary embodiments are not limited thereto. That is, a cross section of the folded substrate integrated waveguide FSIW may be in the form of a circle, and may be variously modified. In addition, the folded substrate integrated waveguide FSIW for forming the multi-mode transmission line 150 may be formed by using the upper conductive layer and the lower conductive layer of the PCB substrate 160, but exemplary embodiments are not limited to using the upper conductive layer and the lower conductive layer of the PCB substrate 160, and in some embodiments the FSIW for forming the multi-mode transmission line 150 may be formed by using any conductive layers positioned within the PCB substrate 160.

Figure 3:
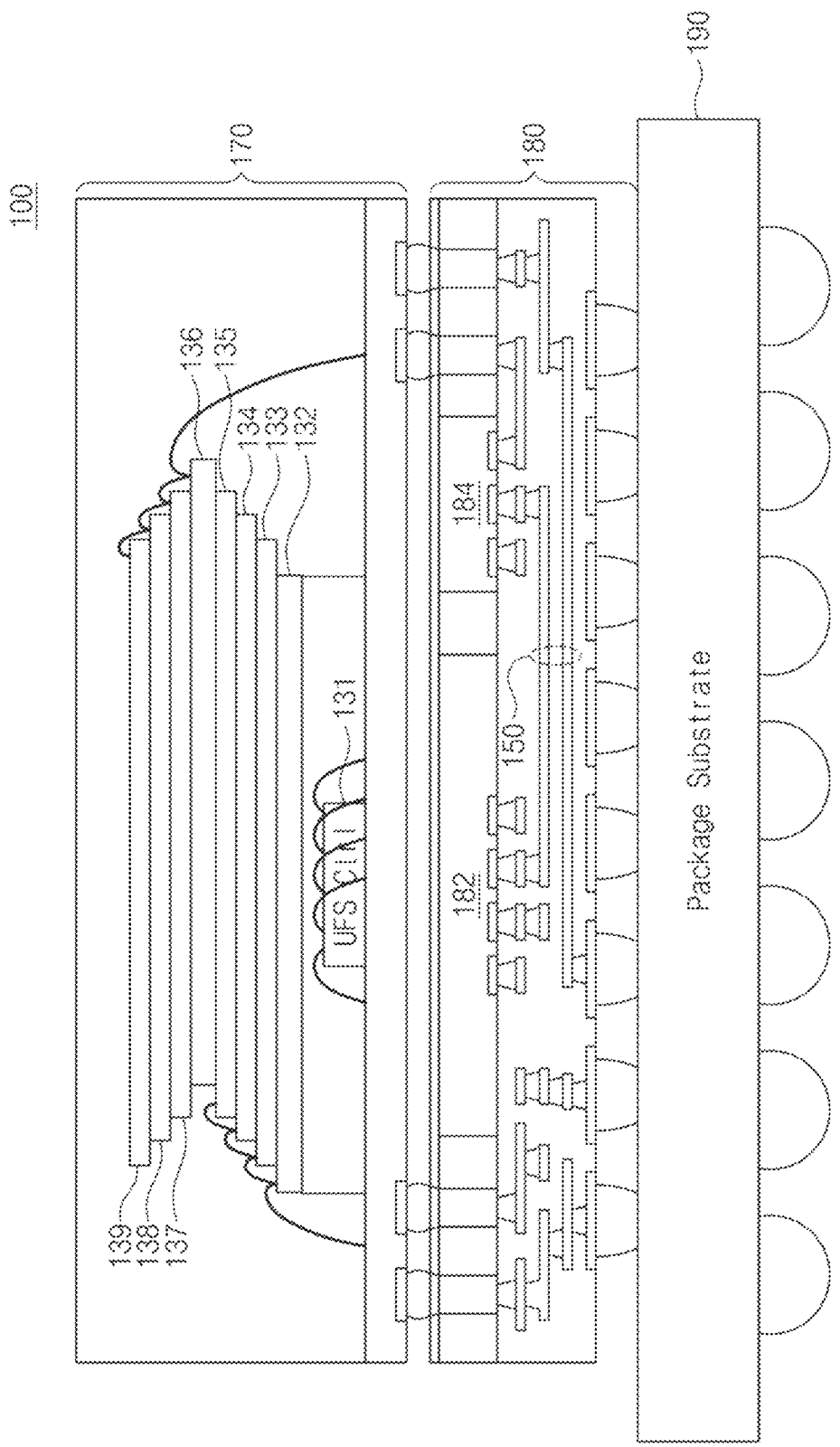
FIG. 3 is a cross-sectional view illustrating another example of a storage device using a multi-mode transmission line according to an exemplary embodiment.

FIG. 3 is a cross-sectional view illustrating another example of a storage device using a multi-mode transmission line according to an exemplary embodiment. Referring to FIG. 3, the storage device 100 may include an upper package 170, a lower package 180, and a package substrate 190.

A universal flash storage (UFS) controller 131 and a plurality of nonvolatile memory devices 132 to 139 may be included in the upper package 170. The UFS controller 131 may perform substantially the same function of the storage controller 110 of FIG. 1. The UFS controller 131 and the plurality of stacked nonvolatile memory devices 132 to 139 may perform chip-to-chip communication through a silicon interposer provided through the lower package 180. The upper package 170 may be connected to the lower package 180 by external terminals (e.g., solder balls) formed on a lower surface of the upper package 170.

The lower package 180 may be provided as a silicon interposer of the upper package 170. In addition, separate chips 182 and 184 may be additionally mounted in the lower package 180. For example, additional chips such as a neural network engine may be mounted in the lower package 180. According to some exemplary embodiments, the multi-mode transmission line 150 for chip-to-chip communication may be included in the lower package 180. A wide I/O interface may be provided through the multi-mode transmission line 150 according to the exemplary embodiments. The multi-mode transmission line 150 according to the exemplary embodiments may make it possible to reduce a minimum feature size of a silicon interposer, to suppress a crosstalk between signal lines, and to decrease an operating frequency of the RF band.

The multi-mode transmission line 150 may be formed in the lower package 180 including the silicon interposer, by using one layer or a plurality of layers. For example, the multi-mode transmission line 150 may be used as a channel connecting the UFS controller 131 and the nonvolatile memory devices 132 to 139, or may be used as a channel connecting the chips 182 or 183 and the UFS controller 131. However, it may be understood that the multi-mode transmission line 150 according to various exemplary embodiments may be applied to any transmission line requiring a wide I/O interface.

The multi-mode transmission line 150 may include the substrate integrated waveguide SIW and at least one strip line elongated within the substrate integrated waveguide SIW. The substrate integrated waveguide SIW of the exemplary embodiments may be composed of a metal layer and silicon vias formed within the silicon interposer. The silicon vias for forming the substrate integrated waveguide SIW may be arranged at regular intervals. Here, as described above, the silicon vias for forming a waveguide side wall may be formed of a metal wall.

In particular, the substrate integrated waveguide SIW according to an exemplary embodiment may include at least one blind conductor for increasing an effective width (i.e., an effective width in the x-direction) of the waveguide. The blind conductor may include a blind via that is formed in the same direction as vias but is formed to be shorter than a length of a via, or a blind conductive layer that protrudes from the waveguide wall of the substrate integrated waveguide SIW to the inside of the waveguide. In the case where the blind conductor is composed of a plurality of blind vias, the blind vias may be arranged at the same interval as through holes for forming the waveguide wall. However, the blind vias are connected to one of the upper conductive layer or the lower conductive layer to form the folded substrate integrated waveguide FSIW. That is, the blind vias do not extend all the way from the lower conductive layer to the upper conductive layer, but rather the blind vias may be connected to only the upper conductive layer, or the blind vias may be connected to only the lower conductive layer, as described further below. The blind vias may electromagnetically shield or separate strip lines formed within the substrate integrated waveguide SIW.

A description is given that the multi-mode transmission line 150 may be used in a silicon interposer, but the exemplary embodiments are not limited thereto. The folded substrate integrated waveguide FSIW of the exemplary embodiments may be applied to various transmission lines where signals are transmitted.

Figure 4:
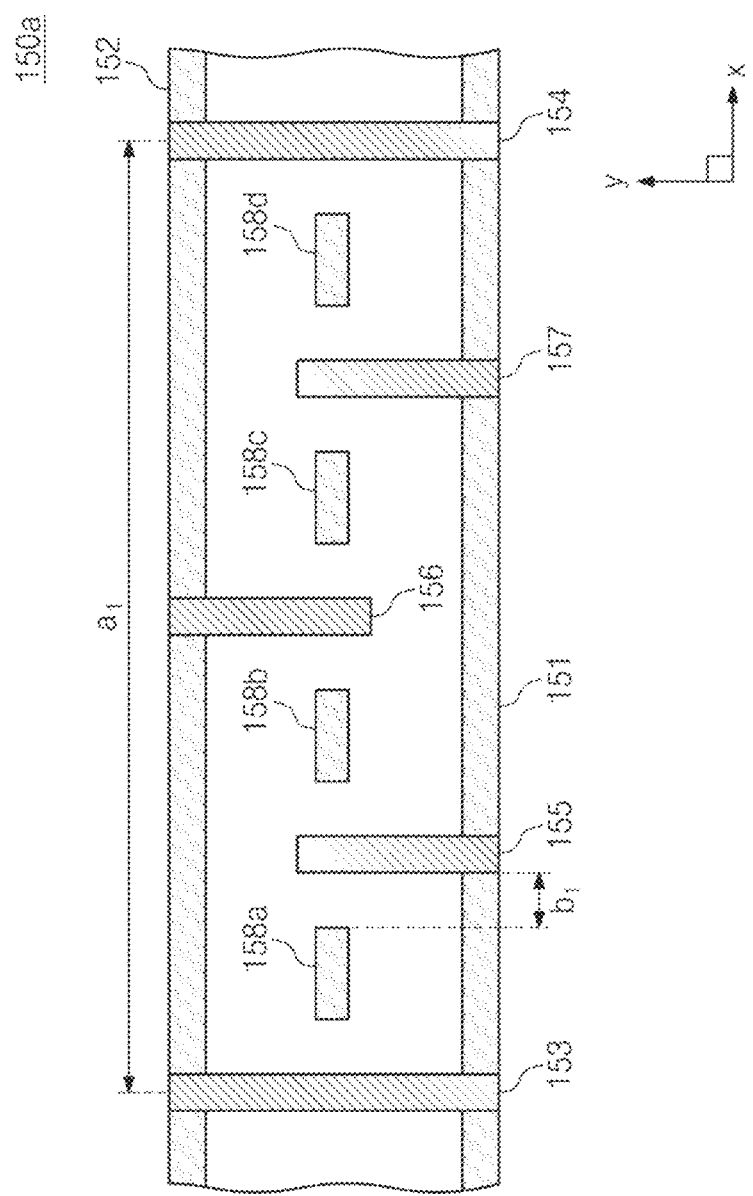
FIG. 4 is a view illustrating a cross section of a multi-mode transmission line including a folded substrate integrated waveguide according to an exemplary embodiment.

FIG. 4 is a view illustrating a cross section of a multi-mode transmission line including a folded substrate integrated waveguide according to an exemplary embodiment. Referring to FIG. 4, a multi-mode transmission line 150a includes a blind conductor that is formed of blind vias 155, 156, and 157. The multi-mode transmission line 150a may include a lower conductive layer 151, an upper conductive layer 152, through vias 153 forming a first waveguide wall, and through vias 154 forming a second waveguide wall, the blind vias 155, 156, and 157, and a plurality of strip lines 158a, 158b, 158c, and 158d. The lower conductive layer 151, the upper conductive layer 152, the first waveguide wall, and the second waveguide wall may together define a volumetric space.

The multi-mode transmission line 150a may be formed within a substrate. Here, the substrate may be a PCB substrate for providing an electrical connection between chips, a silicon interposer, a silicon substrate within a single chip, or a flexible printed circuit board provided to transmit data between chips or devices. The substrate in which the multi-mode transmission line 150a is formed is not particularly limited, and may be variously applied to a system to which a wide I/O interface may be applied. However, for convenience of description, an advantage of the exemplary embodiments will be described through an example where the multi-mode transmission line 150a is formed in a PCB substrate.

The multi-mode transmission line 150a may be formed between any conductive layers formed in the substrate. For example, the multi-mode transmission line 150a may be formed between the lower conductive layer 151 and the upper conductive layer 152. The multi-mode transmission line 150 may be formed of the folded substrate integrated waveguide FSIW and the plurality of strip lines 158a, 158b, 158c, and 158d. The folded substrate integrated waveguide FSIW includes the lower conductive layer 151, the upper conductive layer 152, and the plurality of through vias 153 and 154 connected to both the lower conductive layer 151 and the upper conductive layer 152. In particular, the folded substrate integrated waveguide FSIW may include the blind vias 155, 156, and 157, each of which is connected to only the lower conductive layer 151 or the upper conductive layer 152. That is, the blind vias do not extend all the way from the lower conductive layer to the upper conductive layer, but rather the blind vias may be connected to only the upper conductive layer, or the blind vias may be connected to only the lower conductive layer, as described further below. The folded substrate integrated waveguide FSIW may be grounded or may be maintained at a specific power supply voltage level.

The through vias 153 and 154 may be spaced from each other in the x-direction as much as a waveguide width al as illustrated in FIG. 4. The through vias 153 and 154 illustrated may correspond to a shape shown by a cross section of a xy-plane, and may be arranged at regular intervals in a front direction or a back direction with respect to a surface of paper. That is, with regard to the through via 153, a plurality of through vias may be arranged in a propagation direction of a waveguide to form one side of the waveguide side wall. Likewise, with regard to the through via 154, a plurality of through vias may be arranged in the propagation direction of the waveguide to form an opposite side of the waveguide side wall.

The blind vias 155, 156, and 157 for providing the folded substrate integrated waveguide FSIW may be formed at substantially the same interval with the through vias 153 and 154. However, the blind via 155 is connected to only the lower conductive layer 151. That is, the blind via 155 is connected to the lower conductive layer 151 so as to pass through the lower conductive layer 151, and does not pass through the upper conductive layer 152. Blind vias of the same shape of the blind via 155 may be formed on the front side or the back side with respect to the surface of the paper on which FIG. 4 is drawn at the same interval as the through vias 153 and 154 constituting the waveguide wall. The blind via 156 is connected to only the upper conductive layer 152 so as to pass through the upper conductive layer 152. That is, the blind via 156 may be formed not to reach the lower conductive layer 151. Blind vias of the same shape as the blind via 156 passing through only the upper conductive layer 152 may be formed on the front side or the back side with respect to the surface of paper on which FIG. 4 is drawn at regular intervals. The blind via 157 is connected to only the lower conductive layer 151 so as to pass through the lower conductive layer 151. The blind via 157 may be formed in the same shape as the left blind via 155. In addition, blind vias of the same shape as the blind via 157 may be formed on the front side or the back side with respect to the surface of paper on which FIG. 4 is drawn at regular intervals.

An effective waveguide width a' of the folded substrate integrated waveguide FSIW formed by the blind vias 155, 156, and 157 may be greater than a physical waveguide width $a_1$. That is, a width of a waveguide by which a TE (Transverse Electric) wave propagating along the waveguide is affected corresponds to the effective waveguide width a', not the physical waveguide width $a_1$. A cutoff frequency fc of a typical rectangular waveguide may be expressed by Equation 1 below.

$$f_c = \frac{c}{2a} \quad \text{[Equation 1]}$$

Here, "c" denotes a speed of light, and "a" denotes a width of a waveguide.

The cutoff frequency fc of the typical rectangular waveguide in which the blind vias 155, 156, and 157 do not exist is inversely proportional to a waveguide width. That is, in the case where the blind vias 155, 156, and 157 do not exist, the cutoff frequency fc may be calculated as $c/(2a_1)$. In contrast, the cutoff frequency fc of the folded substrate integrated waveguide FSIW in which the blind vias 155, 156, and 157 are included according to exemplary embodiments may be expressed as c/(2a'). Here, it may be understood that the cutoff frequency fc of the folded substrate integrated waveguide FSIW may be decreased because the effective width a' of the waveguide is greater than the physical width $a_1$.

In addition, an effect in shielding the plurality of strip lines 158a, 158b, 158c, and 158d may be provided by the blind vias 155, 156, and 157. That is, a crosstalk or interference between the plurality of strip lines 158a, 158b, 158c, and 158d may be blocked by the blind vias 155, 156, and 157. The strip line 158a may be spaced from the blind via 155 as much as a separation distance $b_1$. A distance between the strip line 158a and the through via 153 may be defined to correspond to the separation distance $b_1$ between the strip line 158a and the blind via 155, or to have any other separation distance. Advantageously, the blind vias 155, 156, and 157 may be formed to have the same separation distance $b_1$ with respect to the corresponding ones of the plurality of strip lines 158a, 158b, 158c, and 158d. That is, in some exemplary embodiments, the distance between the blind via 155 and the strip line 158a may be the same as the distance between the blind via 155 and the strip line 158b which may be the same as the distance between the strip line 158b and the blind via 156, which may be the same as the distance between the blind via 156 and the strip line 158c, which may be the same as the distance between the strip line 158c and the blind via 157, which may be the same as the distance between the blind via 157 and the strip line 158d, which may be the same separation distance $b_1$. The separation distance $b_1$ may be determined in consideration of an efficiency of suppressing a crosstalk between the strip lines 158a, 158b, 158c, and 158d. However, this is only an example and it may be well understood that a separation distance (e.g., $b_1$) between a blind via and a strip line may be changed according to various purposes.

A signal-to-noise ratio (SNR) of a signal that is transmitted through a strip line may be improved by suppressing the crosstalk or interference. Here, each of the plurality of strip lines 158a, 158b, 158c, and 158d may be a set of data (DQ) lines included in one channel. Alternatively, the plurality of strip lines 158a, 158b, 158c, and 158d may be data lines included in different channels.

The multi-mode transmission line 150 according to an exemplary embodiment is described as the blind vias 155, 156, and 157 for forming the folded substrate integrated waveguide FSIW are at three positions, but the exemplary embodiments are not limited thereto. The number of blind vias shown in the cross-sectional view of the folded substrate integrated waveguide FSIW is not limited and may be increased or decreased. That is, the number of blind vias is not limited to four as shown in FIG. 4. In addition, a structure of the multi-mode transmission line 150 is described in which the plurality of strip lines 158a, 158b, 158c, and 158d are formed at a central position in a space between the lower conductive layer 151 and the upper conductive layer 152, but the exemplary embodiments are not limited thereto. For example, the plurality of strip lines 158a, 158b, 158c, and 158d may be formed to be closer to the lower conductive layer 151 or to be closer to the upper conductive layer 152. Alternatively, the plurality of strip lines 158a, 158b, 158c, and 158d may be arranged in a zigzag shape in the x-direction by using different metal layers.

Figure 5:
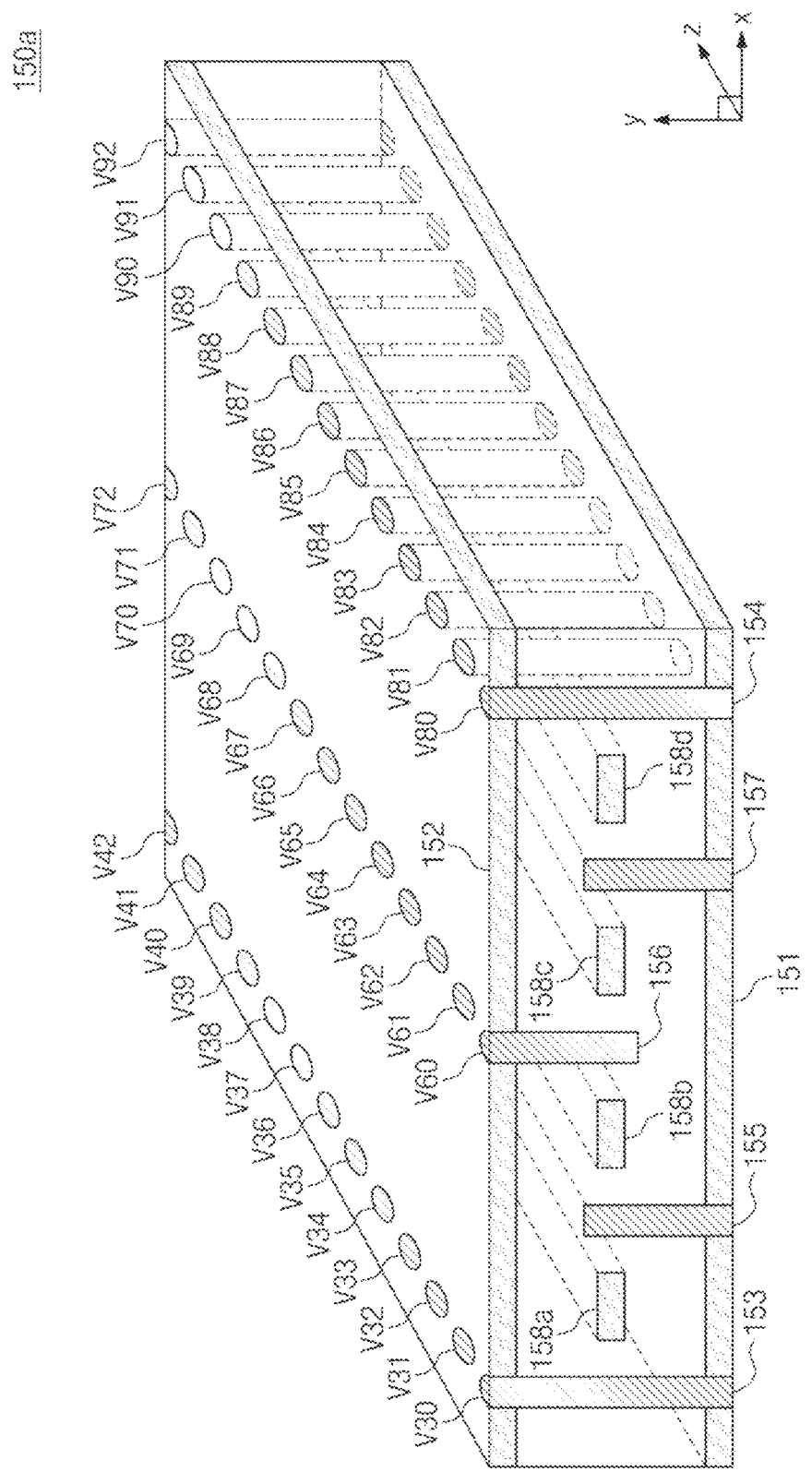
FIG. 5 is a three-dimensional view of the multi-mode transmission line of FIG. 4.

FIG. 5 is a three-dimensional view of the multi-mode transmission line of FIG. 4. Referring to FIG. 5, the multi-mode transmission line 150a includes the folded substrate integrated waveguide FSIW and the plurality of strip lines 158a, 158b, 158c, and 158d. The folded substrate integrated waveguide FSIW includes the lower conductive layer 151, the upper conductive layer 152, through vias V30 to V42 for forming a left waveguide wall, through vias V80 to V92 for forming a right waveguide wall, and blind vias 156 (V60 to V72), blind vias 155, and blind vias 157. Here, the blind vias 155 and 157 may be formed in a similar manner to blind vias V60 to V72 but at different positions from the blind vias V60 to V72 and may have the same shape as the blind vias V60 to V72.

The left waveguide wall for forming the folded substrate integrated waveguide FSIW is implemented with the through vias V30 to V42. The right waveguide wall for forming the folded substrate integrated waveguide FSIW is implemented with the through vias V80 to V92. The through vias V30 to V42 and V80 to V92 may be regularly arranged in the z-direction being a propagation direction of the waveguide. The blind vias V60 to V72 may be shorter in length than the through vias V30 to V42 and V80 to V92, may pass through only the upper conductive layer 152, and may be arranged at regular intervals in the z-direction like the through vias V30 to V42 and V80 to V92. Although not illustrated in FIG. 5, blind vias of the same size as the blind vias 155 and 157 passing through the lower conductive layer 151 may be arranged at regular intervals in the z-direction.

Figure 6:
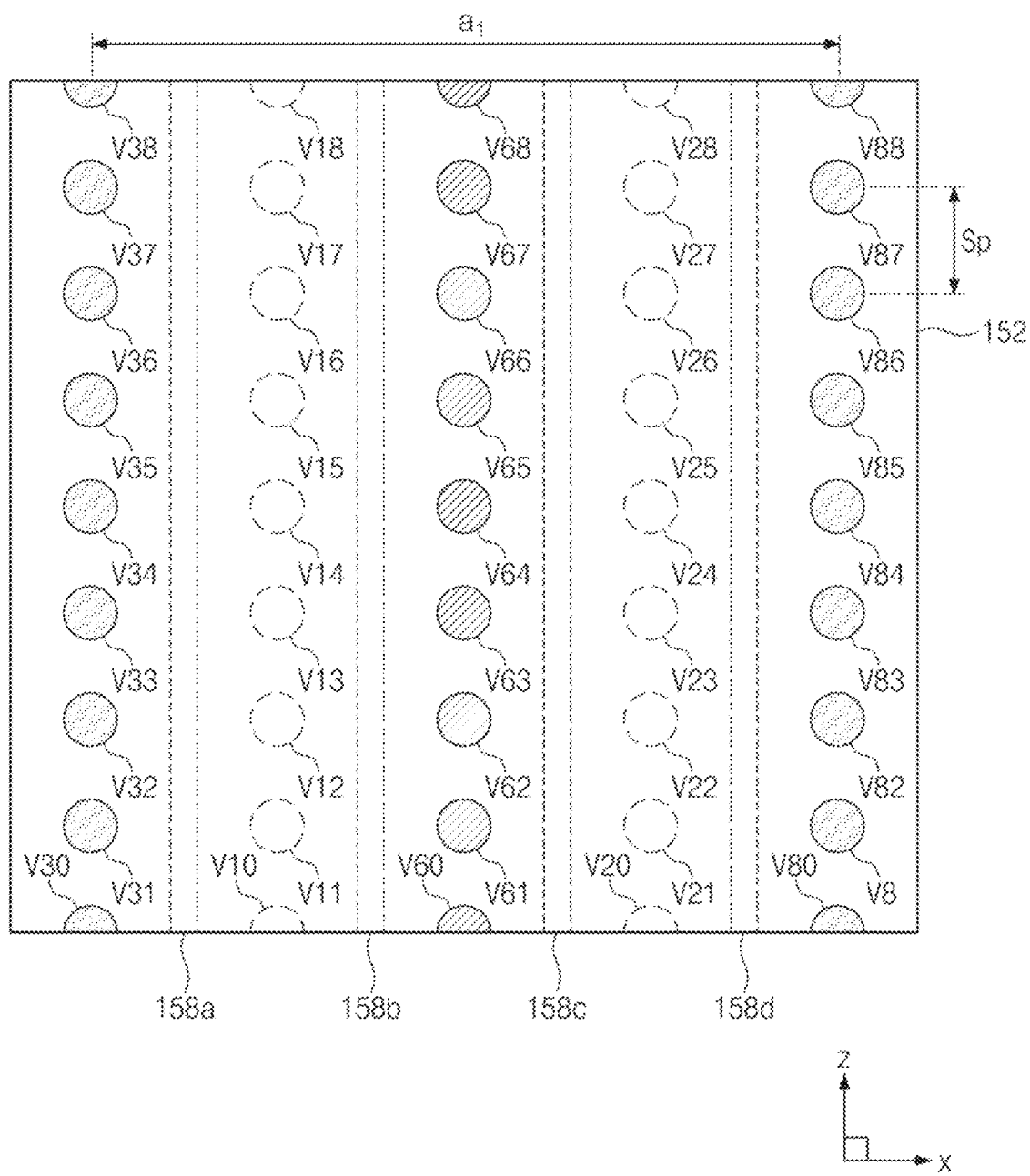
FIG. 6 is a plan view of the multi-mode transmission line of FIG. 5 when viewed from above the top.

FIG. 6 is a plan view of a multi-mode transmission line of FIG. 5 when viewed from above the top. Referring to FIG. 6, the multi-mode transmission line 150a includes the folded substrate integrated waveguide FSIW and the plurality of strip lines 158a, 158b, 158c, and 158d. The through vias V30 to V38, V80 to V88 and the blind vias V10 to V18, V20 to V28, and V60 to V68 constituting the waveguide wall are provided to form the folded substrate integrated waveguide FSIW. Here, cross sections of the through vias V30 to V38 and V80 to V88 and the blind vias V60 to V68 passing through the upper conductive layer 152 are illustrated by a solid line. Cross sections of the blind vias V10 to V18 and V20 to V28 that do not pass through the upper conductive layer 152 are illustrate by a dotted line. The plurality of strip lines 158a, 158b, 158c, and 158d positioned under the upper conductive layer 152 are also illustrated by a dotted line.

The interval al between the waveguide side walls that the through vias V30 to V38 and V80 to V88 form corresponds to a physical width of the folded substrate integrated waveguide FSIW. However, the cutoff frequency fc of the waveguide is determined as not $c/(2a_1)$ but $c/(2a')$ by the existence of the blind vias V10 to V18, V20 to V28, and V60 to V68. The reason is that the effective width a' of the waveguide becomes greater than the physical width $a_1$ by the blind vias V10 to V18, V20 to V28, and V60 to V68. Accordingly, the cutoff frequency fc of the folded substrate integrated waveguide FSIW may be decreased.

Adjacent through vias included in the same column may be periodically arranged with an interval corresponding to a center-to-center distance Sp. With regard to the through vias V30 to V38 and V80 to V88 for forming the waveguide wall, the center-to-center distance Sp may be set to approximately ⅟₁₀ of a wavelength of an operating frequency in a waveguide. With regard to the through vias V30 to V38 and V80 to V88, the center-to-center distance Sp may be set to a value capable of effectively blocking a leakage of an electric field in the waveguide. This value may be determined experimentally. In addition, a description is given as the through vias V30 to V38 for forming the left waveguide wall are arranged in one column and the through vias V80 to V88 for forming the right waveguide wall are arranged in one column, but the exemplary embodiments are not limited thereto. For example, the through vias V30 to V38 may be arranged in two or more columns, and the through vias V80 to V88 may be arranged in two or more columns.

As illustrated in FIG. 6, the blind vias V10 to V18, V20 to V28, and V60 to V68 may also be formed to have the same via interval as the through vias V30 to V38 and V80 to V88. However, the exemplary embodiments are not limited thereto. An inter-via interval associated with the blind vias V10 to V18, V20 to V28, and V60 to V68 may be set to be different from an inter-via interval associated with the through vias V30 to V38 and V80 to V88.

Figure 7:
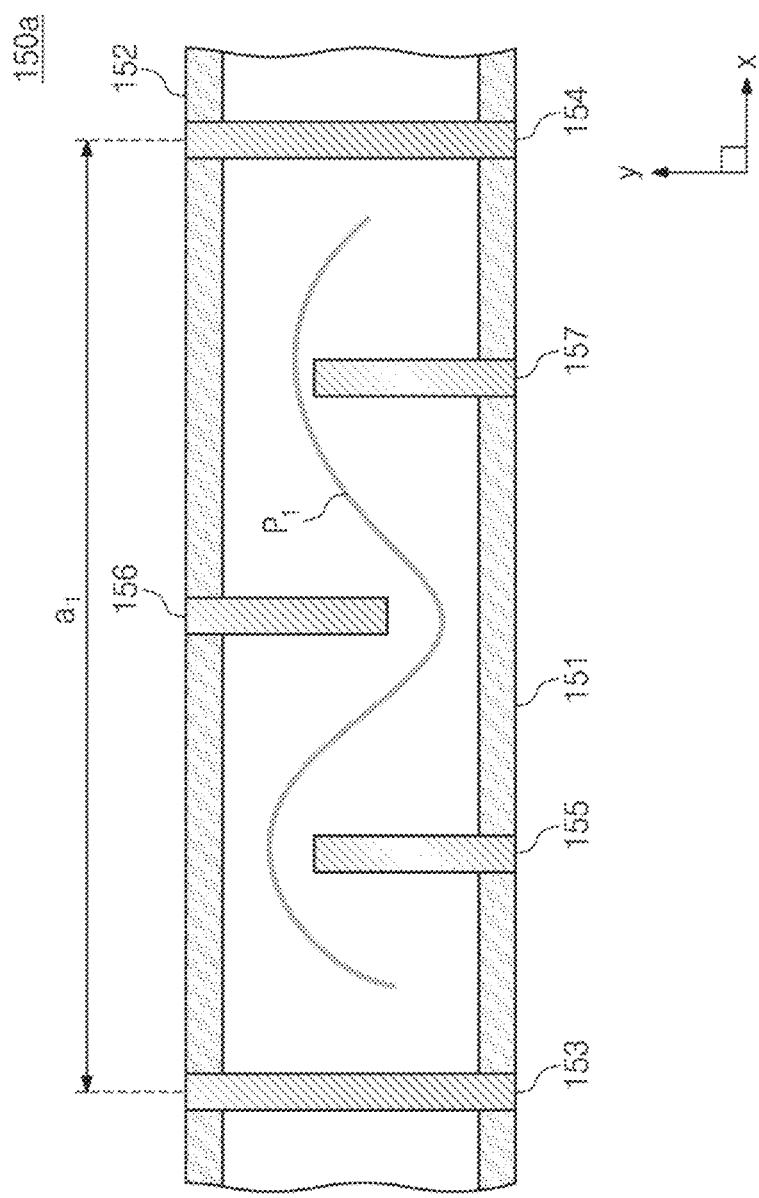
FIG. 7 is a view schematically illustrating how an effective width of a folded substrate integrated waveguide according to exemplary embodiments increases.

FIG. 7 is a view schematically illustrating how an effective width of the folded substrate integrated waveguide FSIW according to exemplary embodiments increases. Referring to FIG. 7, a shape of a magnetic field formed within the folded substrate integrated waveguide FSIW may be modeled by a curve P1.

Due to the blind vias 155, 156, and 157, a shape of an electric field associated with the folded substrate integrated waveguide FSIW may be different from a shape of an electric field associated with the typical rectangular waveguide. A cross section of the magnetic field formed in a horizontal direction within the folded substrate integrated waveguide FSIW may be identical to the curve P1 illustrated in FIG. 7. The blind vias 155, 156, and 157 may allow the effective width a' of the folded substrate integrated waveguide FSIW to be greater than the physical width $a_1$.

Figure 8:
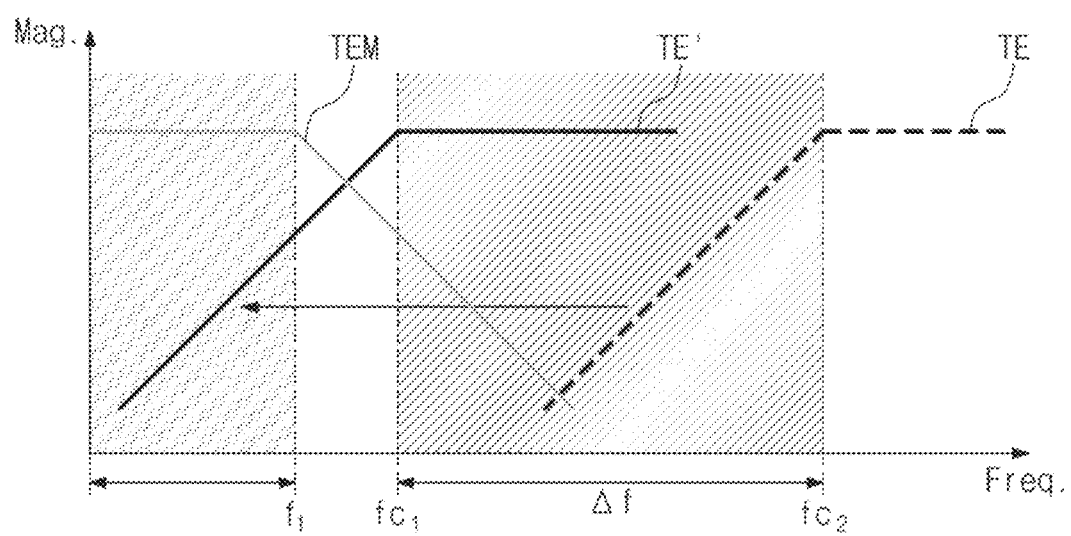
FIG. 8 is a view illustrating a frequency characteristic of a multi-mode transmission line according to exemplary embodiments.

FIG. 8 is a view illustrating a frequency characteristic of a multi-mode transmission line according to exemplary embodiments. Frequency band-based transfer characteristics of a Transverse ElectroMagnetic (TEM) mode for signal propagation of strip lines included in the multi-mode transmission line according to exemplary embodiments and a Transverse Electric (TE) mode of the folded substrate integrated waveguide FSIW and a related art substrate integrated waveguide SIW are illustrated in FIG. 8.

In the case of the TEM mode in which signal transmission is made through strip lines, the signal transmission is possible in a band lower than a frequency $f_1$. In contrast, in the case of the TEM mode, it may be understood that a transfer characteristic of a signal sharply decreases in a band higher than the frequency $f_1$.

In FIG. 8, a curve TE indicates a transfer characteristic of a signal transferred by a related art rectangular substrate integrated waveguide SIW for each frequency. In this case, a cutoff frequency of the related art rectangular substrate integrated waveguide SIW may appear as a second cutoff frequency $fc_2$. This means that an operating frequency of an RF signal transferred by the related art rectangular substrate integrated waveguide SIW is higher than the second cutoff frequency $fc_2$. Accordingly, a system that uses the related art rectangular substrate integrated waveguide SIW has a limitation on an operating frequency for transmitting a signal.

Referring to a transfer characteristic curve TE' of the folded substrate integrated waveguide FSIW of the exemplary embodiments, a first cutoff frequency $fc_1$ of the folded substrate integrated waveguide FSIW becomes lower as an effective width of a waveguide increases. The cutoff frequency $fc_1$ when the folded substrate integrated waveguide FSIW is used may be lower than the cutoff frequency $fc_2$ when the related art rectangular substrate integrated waveguide SIW is used, as much as "$\Delta f$". Accordingly, it may be easier to decrease an operating frequency for transmitting a signal by folded substrate integrated waveguide FSIW that is applied to the multi-mode transmission line of the exemplary embodiments.

Figure 9:
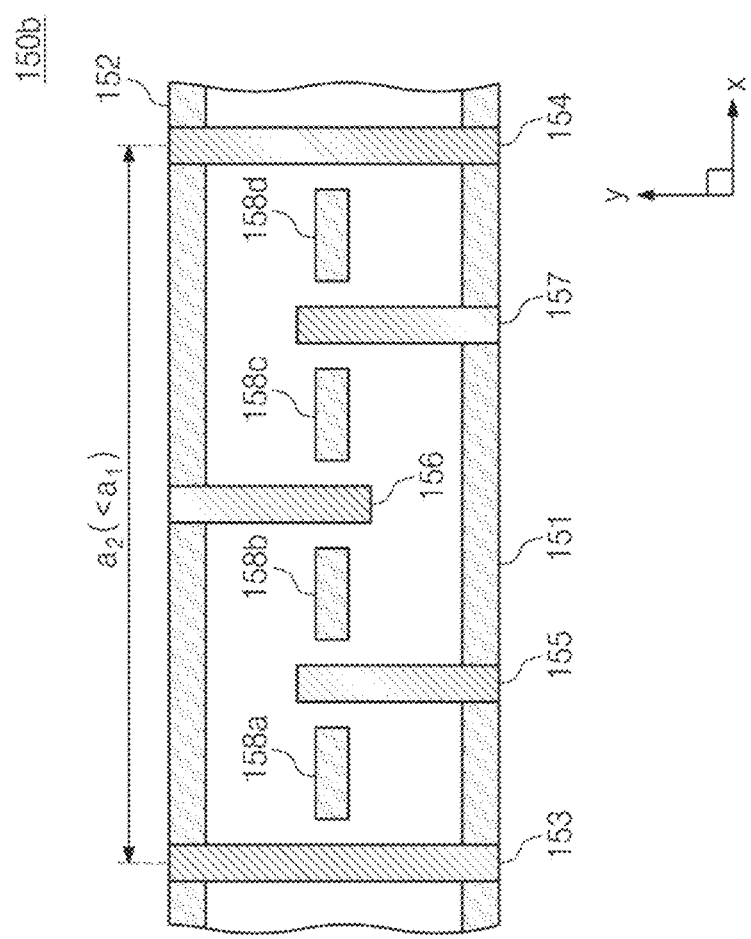
FIG. 9 is a cross-sectional view illustrating a multi-mode transmission line according to another exemplary embodiment.

FIG. 9 is a cross-sectional view illustrating a multi-mode transmission line according to another exemplary embodiment. Referring to FIG. 9, a multi-mode transmission line 150b may include the lower conductive layer 151, the upper conductive layer 152, the through vias 153 and 154 forming a waveguide wall, the blind vias 155, 156, and 157, and the plurality of strip lines 158a, 158b, 158c, and 158d.

The multi-mode transmission line 150b is similar to the multi-mode transmission line 150a of FIG. 4. However, a waveguide width $a_2$ of the multi-mode transmission line 150b may be smaller than the waveguide width $a_1$ of the multi-mode transmission line 150a. Here, as a waveguide width decreases from "$a_1$" to "$a_2$" ($a_2<a_1$), a cutoff frequency fc may increase. However, an effective width secured by the blind vias 155, 156, and 157 may make it possible to compensate for the increase of the cutoff frequency fc of the folded substrate integrated waveguide FSIW. Accordingly, instead of the multi-mode transmission line 150a of FIG. 4, the multi-mode transmission line 150b may be used for a system that has a higher priority for the reduction of size of a transmission line.

Figure 10:
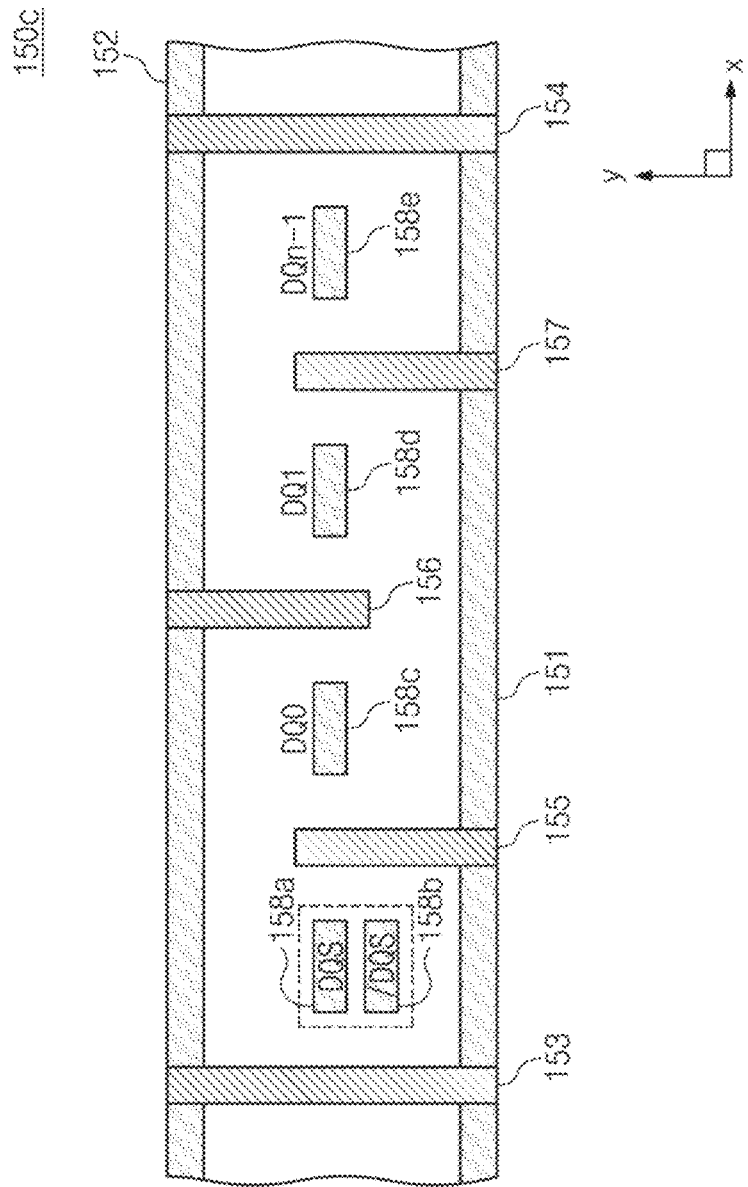
FIG. 10 is a cross-sectional view illustrating a multi-mode transmission line according to another exemplary embodiment.

FIG. 10 is a cross-sectional view illustrating a multi-mode transmission line according to yet another exemplary embodiment. Referring to FIG. 10, a multi-mode transmission line 150c may have adjusted positions where strip lines are placed, based on attributes of signals to be transmitted through the strip lines.

The multi-mode transmission line 150c may include the lower conductive layer 151, the upper conductive layer 152, the through vias 153 and 154 forming a waveguide wall, the blind vias 155, 156, and 157, and a plurality of strip lines 158a, 158b, 158c, 158d, and 158e. The folded substrate integrated waveguide FSIW constituting the multi-mode transmission line 150c may be formed to be substantially identical to the folded substrate integrated waveguide FSIW of FIG. 4. However, the plurality of strip lines 158a, 158b, 158c, 158d, and 158e transmitting signals in the TEM mode may be grouped and positioned according to signal attributes. For example, the strip lines 158a and 158b may be lines transmitting a strobe signal set DQS and /DQS within one channel. The strobe signal set DQS and /DQS may be a set of complementary signals. Accordingly, the strobe signals DQS and /DQS that are transmitted through the strip lines 158a and 158b do not need to consider a mutual influence. As such, the strip lines 158a and 158b that do not need to consider the coupling or interference may be grouped and arranged. That is, the strip lines 158a and 158b that do not need to consider the coupling or interference may not be shielded by a blind conductor. As a result, the strip lines 158a and 158b that do not need to consider the coupling or interference may be positioned in one space, and a blind via or a blind conductive layer may not be formed in the space between the strip lines 158a and 158b. The strip lines 158a and 158b may be formed by using metal lines of different metal layers.

In contrast, the strip lines 158c, 158d, and 158e transmitting data signals DQ0, DQ1, and DQn-1 may be shielded or separated by using the blind vias 156 and 157. In addition, the strip line 158c transmitting the data signal DQ0 may be shielded or separated from the strip lines 158a and 158b, which transmit the strobe signal set DQS and /DQS, through the blind via 155.

According to the exemplary embodiment described with reference to FIG. 10, it is possible to further reduce a width of the folded substrate integrated waveguide FSIW constituting the multi-mode transmission line 150c.

Figure 11:
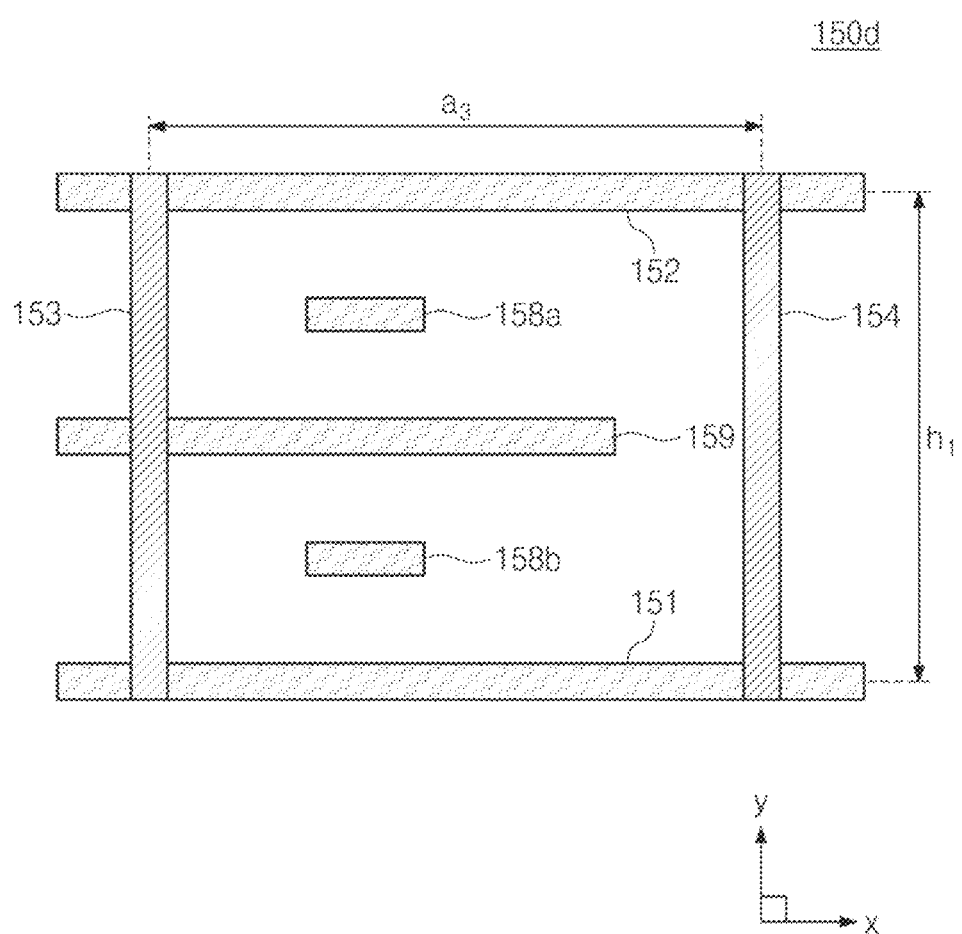
FIG. 11 is a cross-sectional view illustrating a multi-mode transmission line according to another exemplary embodiment.

FIG. 11 is a cross-sectional view illustrating a multi-mode transmission line according to yet another exemplary embodiment. Referring to FIG. 11, a multi-mode transmission line 150d may shield or separate the strip lines 158a and 158b by using a blind conductive layer 159 that is elongated in a longitudinal direction (the x-direction) as a blind conductor.

The multi-mode transmission line 150d may include the lower conductive layer 151, the upper conductive layer 152, the through vias 153 and 154 forming a waveguide wall, the strip lines 158a and 158b, and the blind conductive layer 159. The strip lines 158a and 158b may be formed by using metal lines of different metal layers. In addition, the blind conductive layer 159 may be formed of metal lines or a conductive film that is positioned between metal layers of the strip lines 158a and 158b.

In the case where the strip lines 158a and 158b are formed of metal lines that are positioned in different layers and are arranged in a y-direction, it is possible to reduce a width of the folded substrate integrated waveguide FSIW more easily. That is, it may be possible to easily reduce a waveguide width $a_3$ corresponding to an interval between the through vias 153 and 154 of the folded substrate integrated waveguide FSIW. In the exemplary embodiment shown in FIG. 11, a waveguide width is reduced from $a_2$ to $a_3$ ($a_2 > a_3$), while a waveguide height $h_1$ for forming the strip lines 158a and 158b and the blind conductive layer 159 increases. However, an effective width of a waveguide may be increased as the blind conductive layer 159 is formed.

Accordingly, even though the waveguide width $a_2$ is reduced to the waveguide width $a_3$ ($a_3 < a_2$), the cutoff frequency fc may be decreased by the effective width of the waveguide substantially increased. This structure makes it possible to decrease an operating frequency of the folded substrate integrated waveguide FSIW while effectively suppressing the interference between strip lines in a structure where a width of the folded substrate integrated waveguide FSIW is limited.

Figure 12:
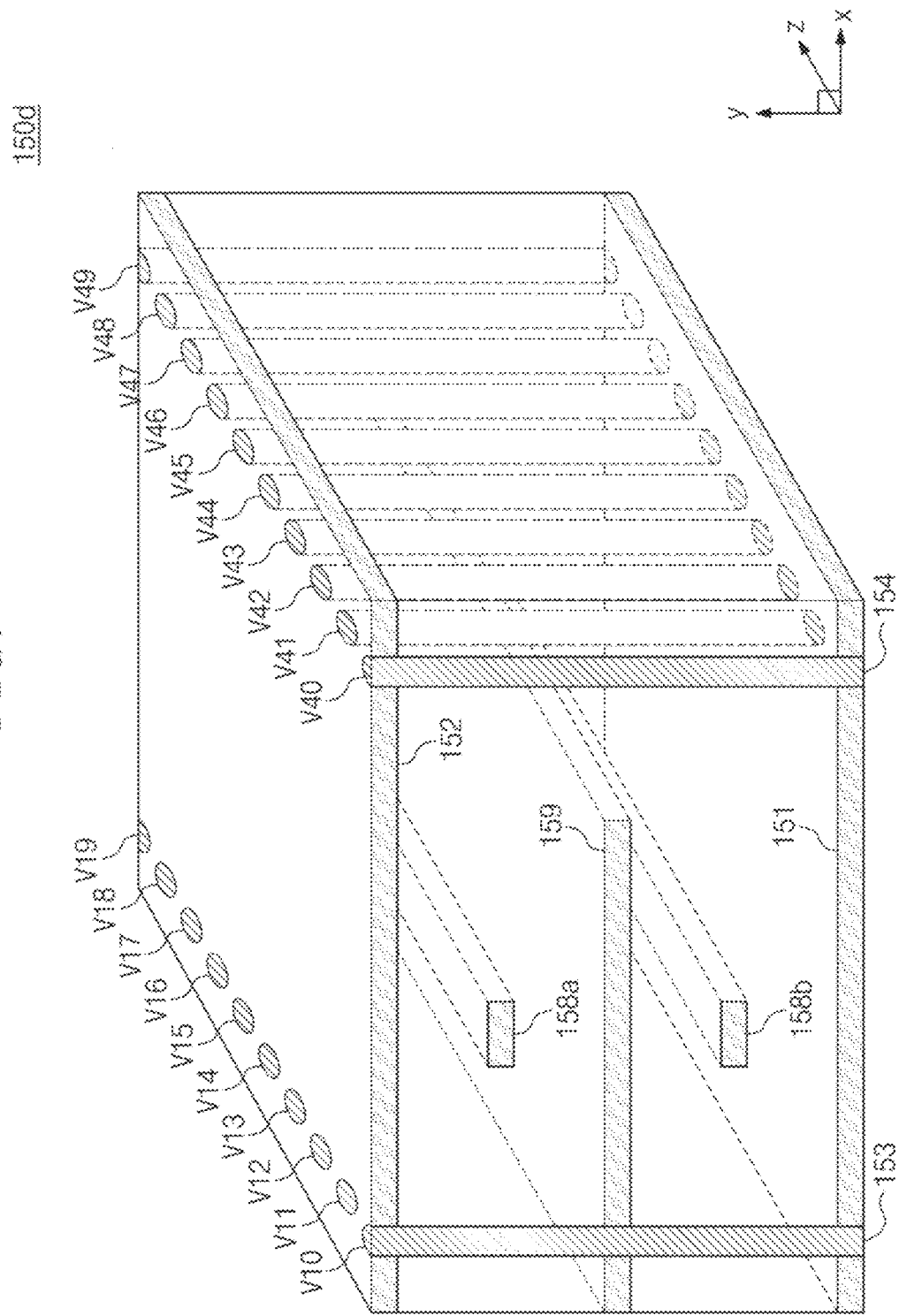
FIG. 12 is a three-dimensional view of the multi-mode transmission line of FIG. 11.

FIG. 12 is a three-dimensional view of the multi-mode transmission line of FIG. 11. Referring to FIG. 12, the multi-mode transmission line 150d may include the folded substrate integrated waveguide FSIW and the strip lines 158a and 158b. The folded substrate integrated waveguide FSIW includes the lower conductive layer 151, the upper conductive layer 152, through vias V10 to V19 for forming a left waveguide wall, through vias V40 to V49 for forming a right waveguide wall, and the blind conductive layer 159.

The left waveguide wall for forming the folded substrate integrated waveguide FSIW is implemented with the through vias V10 to V19. The right waveguide wall for forming the folded substrate integrated waveguide FSIW is implemented with the through vias V40 to V49. The through vias V10 to V19 and V40 to V92 may be arranged regularly with a specific interval in the z-direction being a propagation direction of a waveguide. The blind conductive layer 159 may be formed between metal layers forming the strip lines 158a and 158b. The through vias V10 to V19 may pass through one side of the blind conductive layer 159. Accordingly, the one side of the blind conductive layer 159 may form a side wall of the folded substrate integrated waveguide FSIW together with the through vias V10 to V19. In contrast, the blind conductive layer 159 is separated from a waveguide side wall that the through vias V40 to V49 form. That is, the through vias V40 to V49 do not pass through the blind conductive layer 159.

The multi-mode transmission line 150d having the above-described shape makes it possible to decrease an operating frequency of the folded substrate integrated waveguide FSIW while effectively suppressing the interference between strip lines in a structure where a width of the folded substrate integrated waveguide FSIW is limited. That is, the structure of the multi-mode transmission line 150d provides a means capable of increasing an effective width of a waveguide even though the physical width $a_3$ of the folded substrate integrated waveguide FSIW is additionally reduced.

FIG. 13 is a cross-sectional view illustrating a multi-mode transmission line according to yet another exemplary embodiment. Referring to FIG. 13, a multi-mode transmission line 150e may group positions where strip lines are placed, based on attributes of signals to be transmitted.

The multi-mode transmission line 150e may include the lower conductive layer 151, the upper conductive layer 152, the through vias 153 and 154 forming a waveguide wall, the plurality of strip lines 158a, 158b, and 158c, and the blind conductive layer 159. The folded substrate integrated waveguide FSIW constituting the multi-mode transmission line 150e may be formed to be substantially identical to the folded substrate integrated waveguide FSIW of FIG. 11. However, the plurality of strip lines 158a, 158b, and 158c transmitting signals in the TEM mode may be grouped according to signal attributes, and the strip lines 158a and 158b in a specific group may be excluded from the shielding using the blind conductive layer 159. For example, the strip lines 158a and 158b may be lines transmitting a set of strobe signals DQS and /DQS within one channel. The set of strobe signals DQS and /DQS may be a set of complementary signals. The strip lines 158a and 158b that do not need to consider the coupling or interference may be grouped and arranged. That is, the strip lines 158a and 158b that do not need to consider the coupling or interference may not be shielded by the blind conductive layer 159. As a result, the strip lines 158a and 158b that do not need to consider the coupling or interference may be positioned in one space, and a blind via or a blind conductive layer may not be formed in the space between the strip lines 158a and 158b. The strip lines 158a and 158b may be formed by using metal lines of different metal layers.

In contrast, the strip line 158c transmitting the data signal DQ may be shielded from the strip lines 158a and 158b by using the blind conductive layer 159. Here, a set of signal lines arranged for each group on one side of the blind conductive layer 159 is not limited to the set of strobe signals DQS and /DQS. Signal lines transmitting complementary signals (or signals of complementary levels) may be grouped like the strip lines 158a and 158b.

Figure 14:
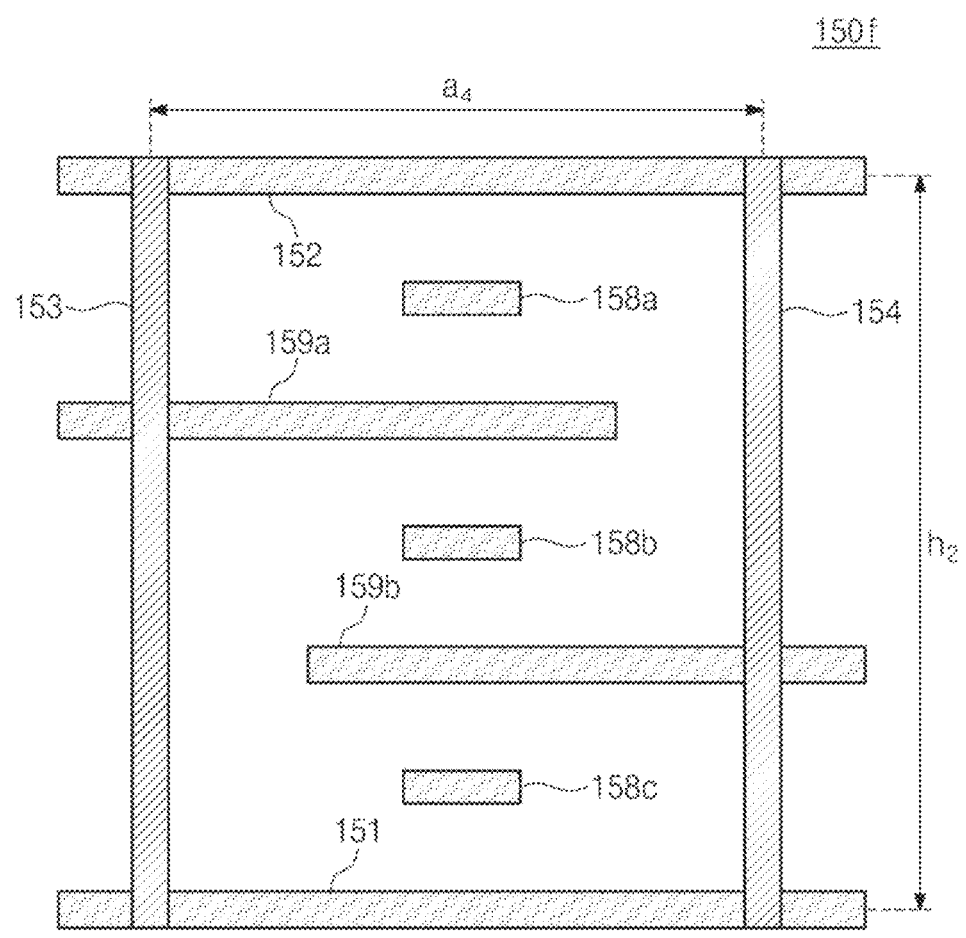
FIG. 14 is a cross-sectional view illustrating a multi-mode transmission line according to yet another exemplary embodiment.

FIG. 14 is a cross-sectional view illustrating a multi-mode transmission line according to yet another exemplary embodiment. Referring to FIG. 14, a multi-mode transmission line 150f may shield or separate the strip lines 158a, 158b, and 158c by using a plurality of blind conductive layers 159a and 159b that are elongated in the longitudinal direction (the x-direction).

The multi-mode transmission line 150f may include the lower conductive layer 151, the upper conductive layer 152, the through vias 153 and 154 forming a waveguide wall, the strip lines 158a, 158b, and 158c, and the blind conductive layers 159a and 159b. The strip lines 158a, 158b, and 158c may be formed by using metal lines of different metal layers. In addition, the blind conductive layers 159a and 159b may be provided by using conductive layers or metal lines between metal layers where the strip lines 158a, 158b, and 158c are positioned.

As illustrated in FIG. 14, the strip lines 158a, 158b, and 158c are formed to have a regular interval in a transverse direction (the y-direction) and to be positioned on the center between the through vias 153 and 154. However, the exemplary embodiments are not limited thereto. The strip lines 158a, 158b, and 158c may be formed to be closer to any one of the through via 153 and the through via 154. Alternatively, the strip lines 158a, 158b, and 158c may be arranged in a zigzag shape with respect to the transverse direction (the y-direction).

Each of the blind conductive layers 159a and 159b are connected with one of the through vias 153 or 154 forming the wall of the folded substrate integrated waveguide FSIW. For example, the blind conductive layer 159a is penetrated by the through via 153 and is spaced from the through via 154. In contrast, the blind conductive layer 159b is penetrated by the through via 154 and is spaced from the through via 153.

In the multi-mode transmission line 150f, the strip lines 158a, 158b, and 158c are arranged in a line in the transverse direction (the y-direction). Accordingly, the blind conductive layers 159a and 159b for separating the strip lines 158a, 158b, and 158c may be formed between the strip lines 158a, 158b, and 158c in a zigzag shape. This structure provides a means that allows a physical width $a_4$ ($a_4 < a_3$) of the folded substrate integrated waveguide FSIW to decrease substantially while uniformly maintaining or increasing an effective width of the folded substrate integrated waveguide FSIW. Of course, a height $h_2$ of the folded substrate integrated waveguide FSIW may increase.

FIG. 15 is a cross-sectional view illustrating a multi-mode transmission line according to yet another exemplary embodiment. Referring to FIG. 15, a multi-mode transmission line 150g may shield or separate strip lines 158a, 158b, 158c, and 158d by using the plurality of blind conductive layers 159a and 159b that are elongated in the longitudinal direction (the x-direction). In addition, positions where strip lines are placed may be grouped according to attributes of channel signals to be transmitted through the strip lines 158a, 158b, 158c, and 158d.

The multi-mode transmission line 150g may include the lower conductive layer 151, the upper conductive layer 152, through vias 153a, 153b, 154a, and 154b forming a waveguide wall, the plurality of strip lines 158a, 158b, 158c, and 158d, and the blind conductive layers 159a and 159b. The folded substrate integrated waveguide FSIW constituting the multi-mode transmission line 150g may be formed to be substantially identical to the folded substrate integrated waveguide FSIW of FIG. 14. However, the plurality of strip lines 158a, 158b, 158c, and 158d transmitting signals in the TEM mode may be grouped according to signal attributes, and the strip lines 158c and 158d in a specific group may be arranged without a shielding.

For example, the strip lines 158c and 158d may be lines transmitting a set of strobe signals DQS and /DQS within one channel. The strip lines 158c and 158d transmitting signals, which do not need to consider the coupling or interference, such as the strobe signals DQS and /DQS may be grouped, and may be arranged without a shielding using a blind conductive layer. That is, the strip lines 158c and 158d that do not need to consider the coupling or interference may not be shielded by a blind conductive layer. As a result, the strip lines 158c and 158d that do not need to consider the coupling or interference may be positioned in one space, and a blind via or a blind conductive layer may not be formed in the space between the strip lines 158c and 158d.

In contrast, the strip lines 158a and 158b transmitting data signals DQm and DQn may be shielded by using the blind conductive layers 159a and 159b. Here, a set of signal lines arranged for each group is not limited to the set of strobe signals DQS and /DQS. Signal lines transmitting complementary signals may be grouped like the strip lines 158c and 158d.

Figure 16:
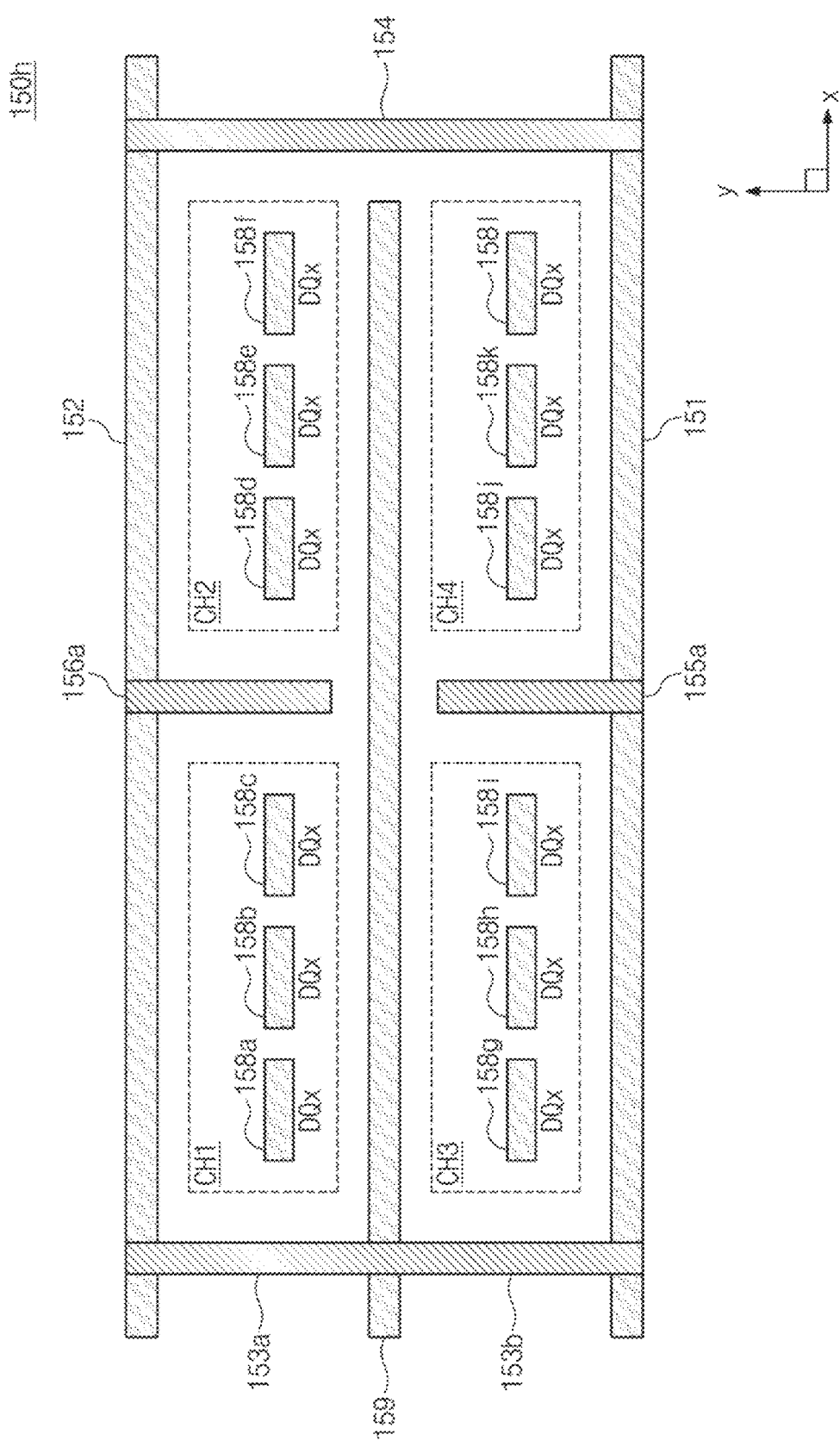
FIG. 16 is a cross-sectional view illustrating a multi-mode transmission line according to yet another exemplary embodiment.

FIG. 16 is a cross-sectional view illustrating a multi-mode transmission line according to yet another exemplary embodiment. Referring to FIG. 16, a multi-mode transmission line 150h may shield or separate strip lines 158a to 158l by using blind vias 155a and 156a formed in the transverse direction (the y-direction) and the blind conductive layer 159 that is elongated in the longitudinal direction (the x-direction).

The multi-mode transmission line 150h may include the lower conductive layer 151, the upper conductive layer 152, through vias 153a, 153b, and 154 forming a waveguide wall, the plurality of strip lines 158a to 158l, and the blind conductive layer 159. The folded substrate integrated waveguide FSIW constituting the multi-mode transmission line 150h may include both the blind vias 155a and 156a formed in the transverse direction (the y-direction) and the blind conductive layer 159 formed in the longitudinal direction (the x-direction). The blind vias 155a and 156a and the blind conductive layer 159 may separate the plurality of strip lines 158a to 158l in the unit of a channel. That is, the blind vias 155a and 156a and the blind conductive layer 159 may separate the plurality of strip lines 158a to 158i in the unit of a channel, thus suppressing inter-channel interference.

In addition, the blind vias 155a and 156a formed in the transverse direction (the y-direction) and the blind conductive layer 159 formed in the longitudinal direction (the x-direction) may make an effective width of the folded substrate integrated waveguide FSIW greater. Accordingly, an RF frequency of a signal that is transmitted through the folded substrate integrated waveguide FSIW in the TE mode is able to be decreased.

Figure 17:
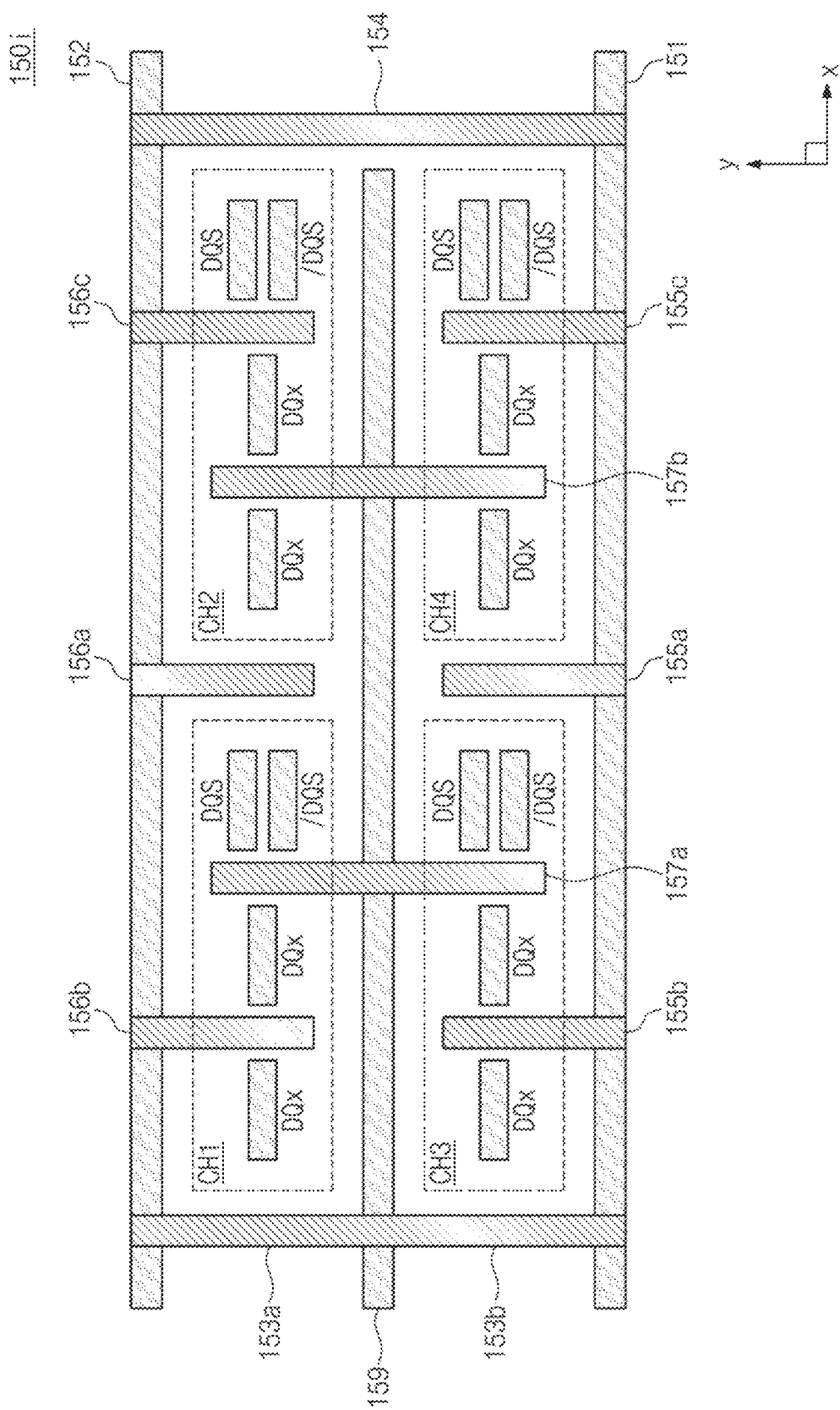
FIG. 17 is a cross-sectional view illustrating a multi-mode transmission line according to yet another exemplary embodiment.

FIG. 17 is a cross-sectional view illustrating a multi-mode transmission line according to yet another exemplary embodiment. Referring to FIG. 17, a multi-mode transmission line 150*i* may include blind vias 155*a* to 155*c*, 156*a* to 156*c*, and 157*a* to 157*b* and the blind conductive layer 159 for the purpose of separating a plurality of strip lines.

The folded substrate integrated waveguide FSIW constituting the multi-mode transmission line 150*i* may shield a plurality of strip lines in unit of a line by using the blind vias 155*a* to 155*c*, 156*a* to 156*c*, and 157*a* to 157*b* and the blind conductive layer 159. Accordingly, the multi-mode transmission line 150*i* may be more efficient than the multi-mode transmission line 150*h* of FIG. 16 in terms of an effect in suppressing the interference between strip lines. In addition, string lines, which transmit signals not requiring a mutual shielding, from among strip lines of each channel may be arranged in the same column.

For example, strip lines, which transmit a set of strobe signals DQS and/DQS, from among strip lines included in the first channel CH1 do not need to consider an influence of coupling or interference. Strip lines transmitting signals that do not need to consider the coupling or interference may be grouped, and may be arranged without a shielding using a blind conductive layer or blind vias. That is, strip lines of each channel that do not need to consider the coupling or interference may not be shielded by a blind conductive layer. As a result, strip lines that do not need to consider the coupling or interference may be positioned in one space, and a blind via or a blind conductive layer may not be formed in the space between the strip lines.

In contrast, strip lines, which transmit data signals DQx, from among strip lines included in the first channel CH1 may be shielded from each other by using the blind vias 156*b* and 157*a*. Strip lines included in the second to fourth channels CH2 to CH4 may be arranged and shielded in the same manner as the first channel CH1. Here, a set of signal lines arranged for each group is not limited to the set of strobe signals DQS and /DQS. Signal lines transmitting complementary signals may be grouped and may be arranged without a shielding.

Figure 18:
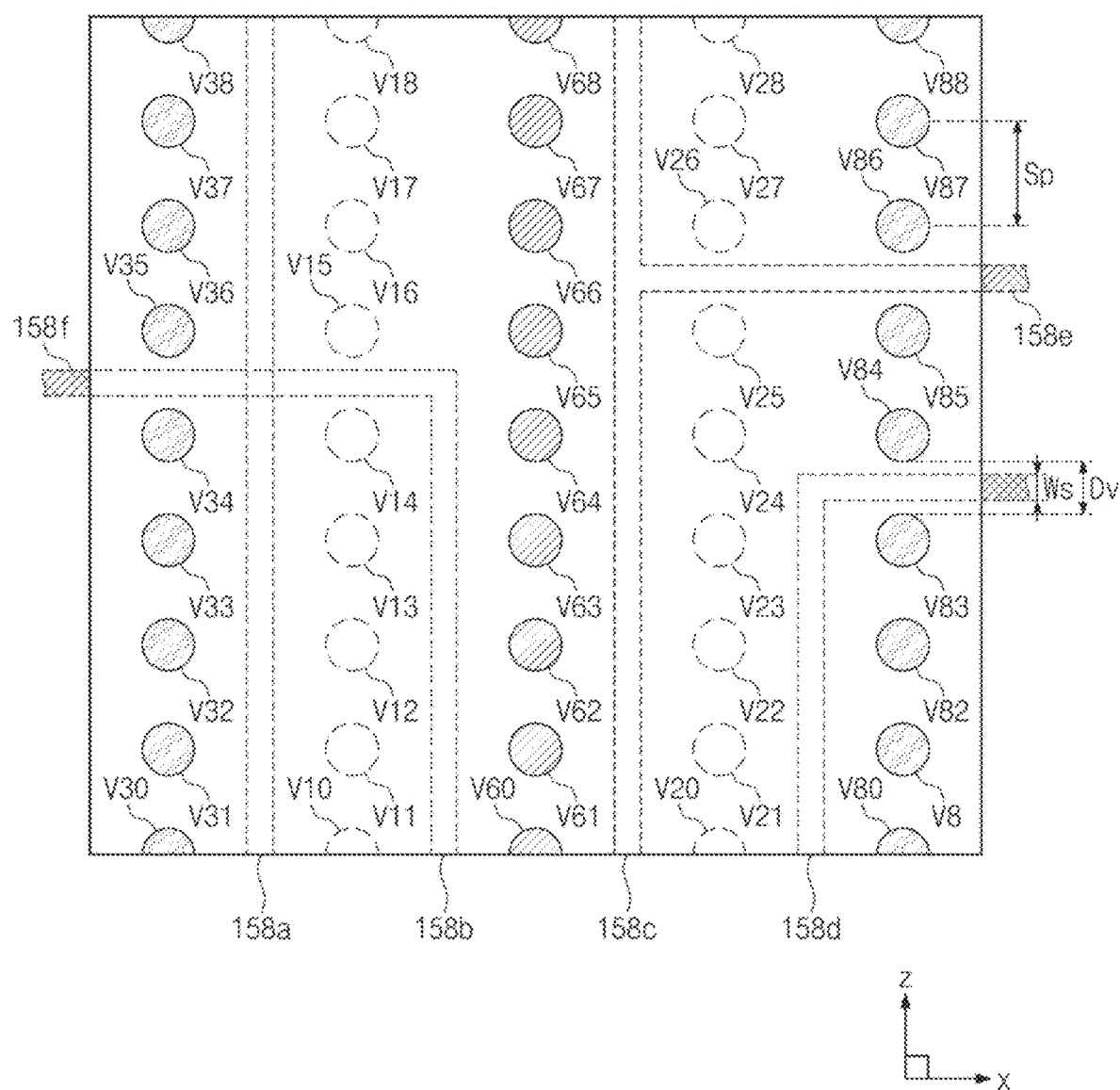
FIG. 18 is a plan view describing an advantage in a multi-mode transmission line according to exemplary embodiments.

FIG. 18 is a plan view describing an advantage in a multi-mode transmission line of various exemplary embodiments. Referring to FIG. 18, in the folded substrate integrated waveguide FSIW of the exemplary embodiments, through vias V30 to V38 and V80 to V88 that are used to form a waveguide wall make it easy for strip lines to branch off or to go in a different direction.

For example, the strip line 158*d* that is introduced to the inside of the folded substrate integrated waveguide FSIW, that is, in the z-direction may turn to the x-direction and may then be withdrawn between the through vias V83 and V84. This is possible because a width Ws of the strip line 158*d* is smaller than an interval Dv between the through vias V83 and V84. In addition, the strip line 158*c* that is elongated to the inside of the folded substrate integrated waveguide FSIW, that is, in the z-direction may branch off to form the strip line 158*e* elongated in the x-direction. The strip line 158*e* may pass through a space between the through vias V85 and V86 and may be withdrawn to the outside of the folded substrate integrated waveguide FSIW.

Also, the strip line 158*b* that is introduced to the inside of the folded substrate integrated waveguide FSIW, that is, in the z-direction may turn to a direction opposite to the x-direction, and may then be withdrawn between the through vias V34 and V35. In an embodiment, the strip line 158*b* may be formed of a metal line of a different layer from the strip line 158*a* so as not to intersect the strip line 158*a*.

The multi-mode transmission line of the exemplary embodiments may include the folded substrate integrated waveguide FSIW in which a waveguide wall is formed by using through vias. Accordingly, strip lines may be introduced to the inside of a waveguide and may then be withdrawn in a direction perpendicular to a propagation direction of the waveguide. This structure may provide the high freedom of routing upon designing a device or a system including the multi-mode transmission line of the inventive concept, even though the folded substrate integrated waveguide FSIW is included in the multi-mode transmission line.

Figure 19:
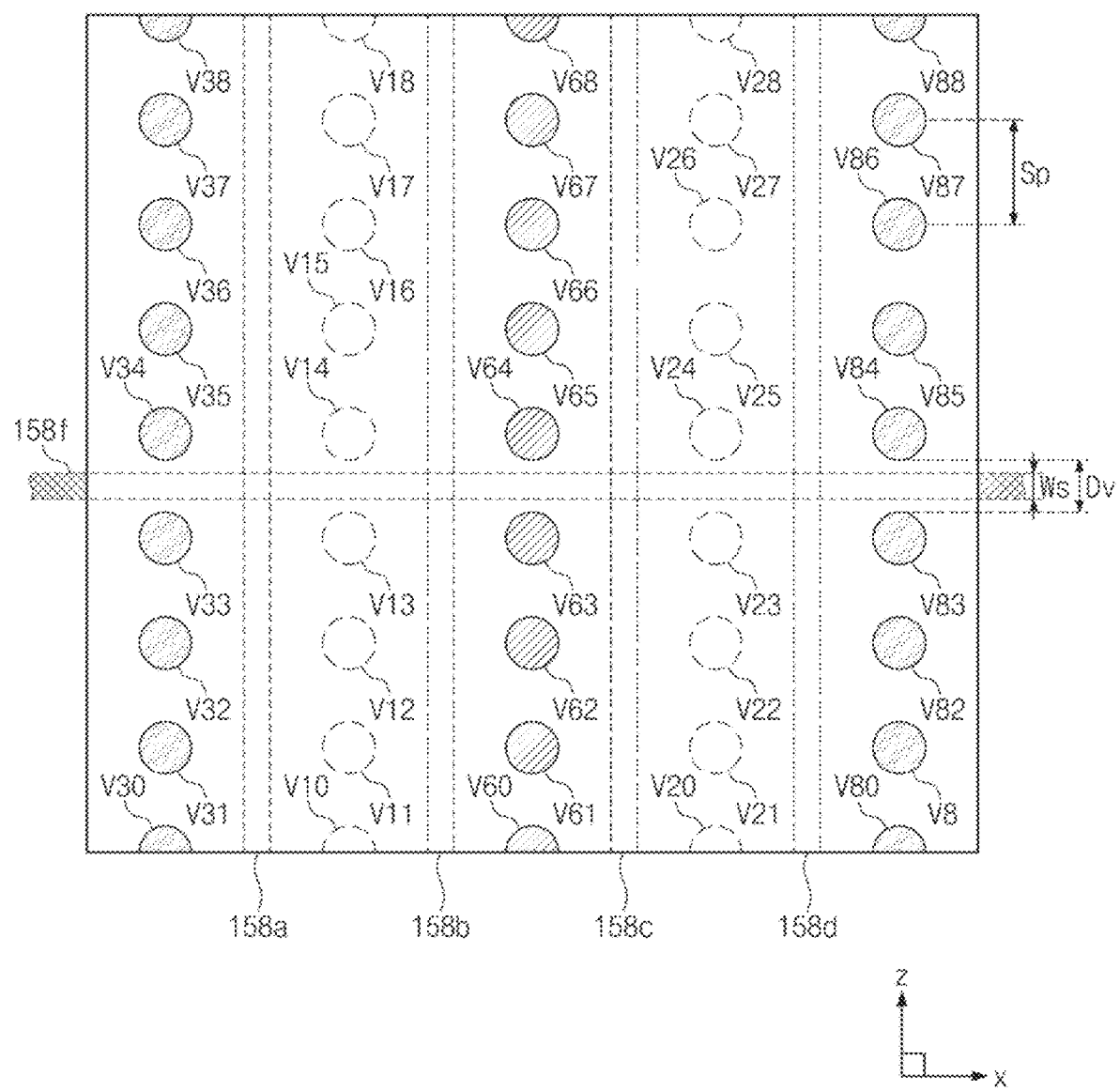
FIG. 19 is a plan view describing another advantage in a multi-mode transmission line according to exemplary embodiments.

FIG. 19 is a plan view describing another advantage in a multi-mode transmission line of the various exemplary embodiments. Referring to FIG. 19, in the folded substrate integrated waveguide FSIW of the exemplary embodiments, because a waveguide wall is formed by using through vias V30 to V38 and V80 to V88, a strip line 158*f* may be routed to pass through the folded substrate integrated waveguide FSIW.

The strip lines 158*a*, 158*b*, 158*c*, and 158*d* constituting the multi-mode transmission line may be introduced to the inside of the folded substrate integrated waveguide FSIW, that is, in the z-direction. In addition, the strip 158*f* that is elongated in the x-direction and is not associated with the multi-mode transmission line may pass through the folded substrate integrated waveguide FSIW. This is possible because a width Ws of the strip line 158*f* is smaller than an interval by which the through vias V83 and V84 and V33 to V34 and the blind vias V13 and V14, V23 and V24, and V63 and V64 are spaced from each other. Also, this is possible because the strip line 158*f* passing through the folded substrate integrated waveguide FSIW in the x-direction is positioned in a different metal layer from the strip lines 158*a*, 158*b*, 158*c*, and 158*d*.

The wall structure of the folded substrate integrated waveguide FSIW of the exemplary embodiments may provide the high freedom of routing even upon designing a system including complicated signal lines.

Figure 20:
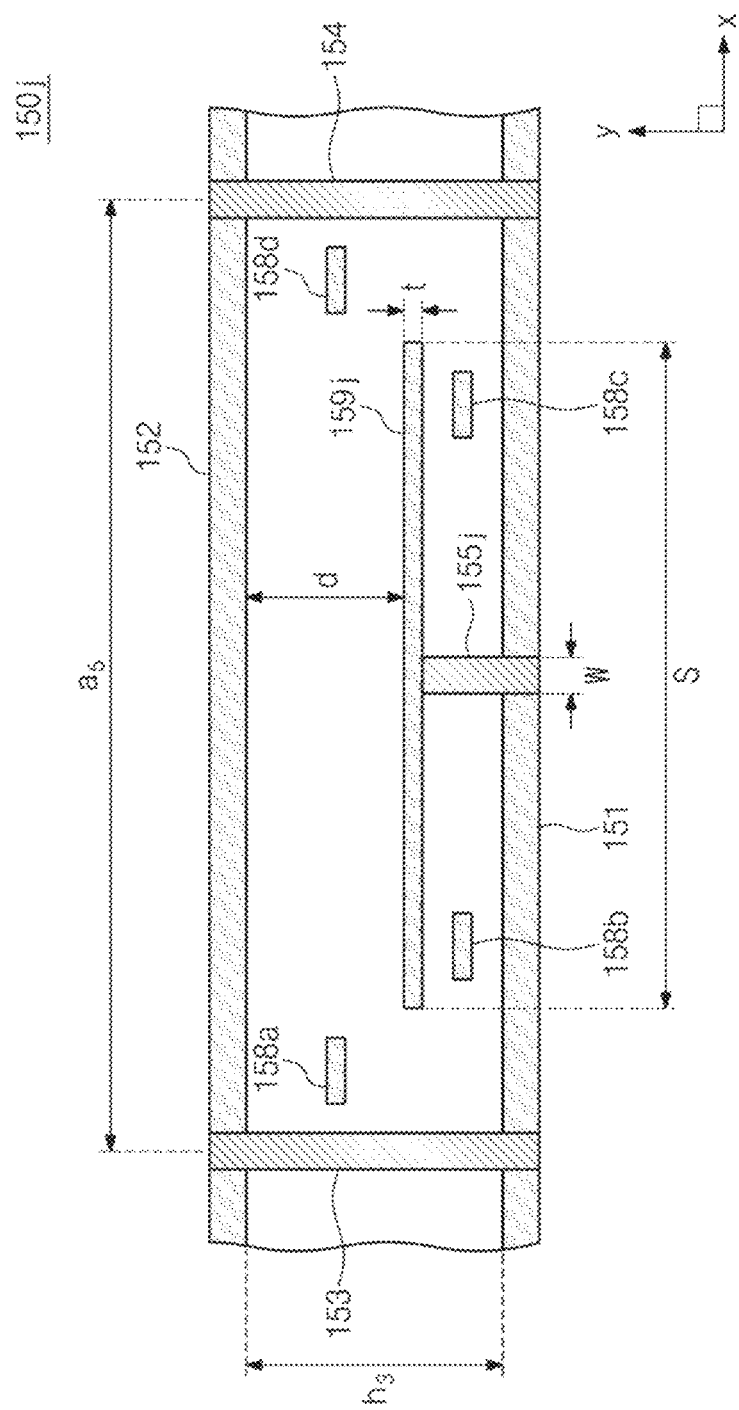
FIG. 20 is a view illustrating a cross-sectional view illustrating a multi-mode transmission line according to yet another exemplary embodiment.

FIG. 20 is a view illustrating a cross-sectional view illustrating a multi-mode transmission line according to yet another exemplary embodiment. Referring to FIG. 20, a multi-mode transmission line 150*j* has a T-shaped blind conductor. The multi-mode transmission line 150*j* may include the lower conductive layer 151, the upper conductive layer 152, the through vias 153 and 154 forming a waveguide side wall, a blind conductor (155*j*, 159*j*), and the plurality of strip lines 158*a*, 158*b*, 158*c*, and 158*d*.

The multi-mode transmission line 150*j* may be formed within a substrate. Here, the substrate may be a PCB substrate for providing an electrical connection between chips, a silicon interposer, a silicon substrate within a single chip, or a flexible printed circuit board (FPCB) provided to transfer data between chips or devices. The substrate in which the multi-mode transmission line 150*j* of the inventive concept is formed is not limited to the present disclosure, and may be variously applied to a system to which a wide I/O interface may be applied. However, for convenience of description, the features of the inventive concept will be described through an example where the multi-mode transmission line 150*j* of the inventive concept is formed in a PCB substrate.

The multi-mode transmission line 150*j* may be formed between any conductive layers formed in a substrate. For example, the multi-mode transmission line 150*j* may be formed between the lower conductive layer 151 and the upper conductive layer 152. The lower conductive layer 151 and the upper conductive layer 152 may be spaced from each other as much as a distance of "h3". The multi-mode transmission line 150j may be composed of a T-type folded substrate integrated waveguide T-FSIW and the plurality of strip lines 158a, 158b, 158c, and 158d. The T-type folded substrate integrated waveguide T-FSIW includes the lower conductive layer 151, the upper conductive layer 152, and the plurality of through vias 153 and 154 connected to both the lower conductive layer 151 and the upper conductive layer 152. In particular, the T-type folded substrate integrated waveguide T-FSIW may include the T-shaped blind conductor (155j, 159j) that is connected to only one of the lower conductive layer 151 and the upper conductive layer 152. The T-type folded substrate integrated waveguide T-FSIW may be grounded or may be maintained at a specific power supply voltage level.

The through vias 153 and 154 may be spaced from each other in the x-direction as much as a waveguide width as. The through vias 153 and 154 illustrated may correspond to a shape shown by a cross section of an xy plane, and may be formed on a bottom surface so as to be arranged at regular intervals in a front direction or a back direction. That is, a plurality of through vias that are arranged in a propagation direction of a waveguide may be formed on one side of the through via 153 for the purpose of forming one side of the waveguide side wall. Likewise, a plurality of through vias that are arranged in the propagation direction of the waveguide may be formed on one side of the through via 154 for the purpose of forming an opposite side of the waveguide side wall.

The T-shaped blind conductor (155j, 159j) is formed to provide the T-type folded substrate integrated waveguide T-FSIW. The T-shaped blind conductor (155j, 159j) is composed of a lower blind conductor 155j and an upper blind conductor 159j. In another embodiment, the lower blind conductor 155j may be formed of a plurality of blind vias. The upper blind conductor 159j of the T-shaped blind conductor (155j, 159j) may be formed to have a thickness of "t" and a width of "S". The upper blind conductor 159j may be spaced from the upper conductive layer 152 as much as a distance of "d". Also, the lower blind conductor 155j may be formed to have a thickness of "W".

Here, it is assumed that an operating frequency of a signal transferred to the T-type folded substrate integrated waveguide T-FSIW is "1.2 GHz" on the basis of a 2.4 Gpbs transfer speed using the multi-mode transmission line 150j. In this case, it is assumed that a dielectric constant εr of a substrate, a ratio $S/a_5$ of conductive layer widths is "0.8", "$d/h_3$" indicating a relative position of the upper blind conductor 159j is "0.9". Under the above condition, when the waveguide width as is "1.87 mm", a cutoff frequency $f_C$ of the multi-mode transmission line 150j is "8 GHz". In contrast, under the above condition, when the waveguide width $a_5$ is "0.57 mm", a cutoff frequency $f_C$ of the multi-mode transmission line 150j is "26.5 GHz".

Each of the plurality of strip lines 158a, 158b, 158c, and 158d may be a set of data (DQ) lines included in one channel. Alternatively, each of the plurality of strip lines 158a, 158b, 158c, and 158d may be composed of data lines included in different channels. The plurality of strip lines 158a, 158b, 158c, and 158d may be formed at any positions in the folded substrate integrated waveguide FSIW. However, it is desired that the plurality of strip lines 158a, 158b, 158c, and 158d are disposed in a space where an electric field is focused by the upper blind conductor 159j and the upper conductive layer 152.

Figure 21:
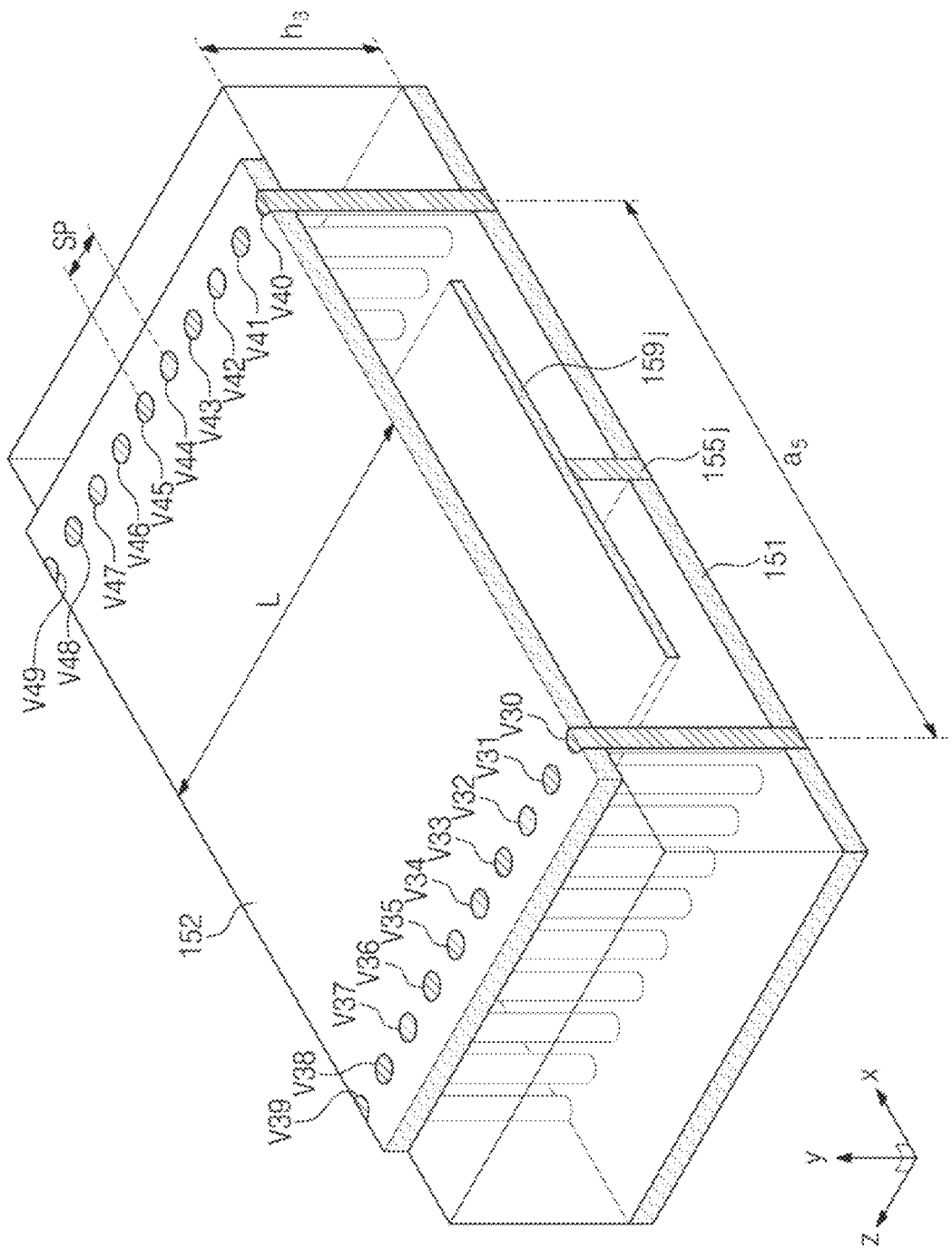
FIG. 21 is a view illustrating a three-dimensional shape of a T-type folded substrate integrated waveguide (T-FSIW) in the multi-mode transmission line of FIG. 20.

FIG. 21 is a view illustrating a three-dimensional shape of the T-type folded substrate integrated waveguide T-FSIW in the multi-mode transmission line of FIG. 20. Referring to FIG. 21, the T-type folded substrate integrated waveguide T-FSIW includes the lower conductive layer 151, the upper conductive layer 152, the through vias V30 to V39 for forming a left waveguide side wall, the through vias V40 to V49 for forming a right waveguide side wall, and the T-shaped blind conductor (155j, 159j).

The left waveguide side wall for forming the T-type folded substrate integrated waveguide T-FSIW is formed by the through vias V30 to V39. The right waveguide side wall for forming the T-type folded substrate integrated waveguide T-FSIW is formed by the through vias V40 to V49. The through vias V30 to V39 and V40 to V49 may be regularly arranged between the lower conductive layer 151 and the upper conductive layer 152 and in the z-direction being a propagation direction of a waveguide. The T-type folded substrate integrated waveguide T-FSIW is illustrated in FIG. 21 as much as a length "L" of a waveguide. However, the T-type folded substrate integrated waveguide T-FSIW may be extended in the same shape as much as a required length if necessary.

Adjacent through vias included in the same column may be periodically arranged with an interval corresponding to a center-to-center distance Sp. With regard to the through vias V30 to V39 and V40 to V49 for forming the waveguide side wall, the center-to-center distance Sp may be set to ¹⁄₁₀ to ¼ of a wavelength in a waveguide associated with an operating frequency. With regard to the through vias V30 to V39 and V40 to V49, the center-to-center distance Sp may be set to a value capable of effectively blocking a leakage of an electric field in the waveguide. In addition, a description is given as the through vias V30 to V39 and V40 to V49 are arranged in one column in the waveguide wall, but the inventive concept is not limited thereto. For example, the through vias V30 to V39 and the through vias V40 to V49 may be arranged in two or more columns.

Figure 22:
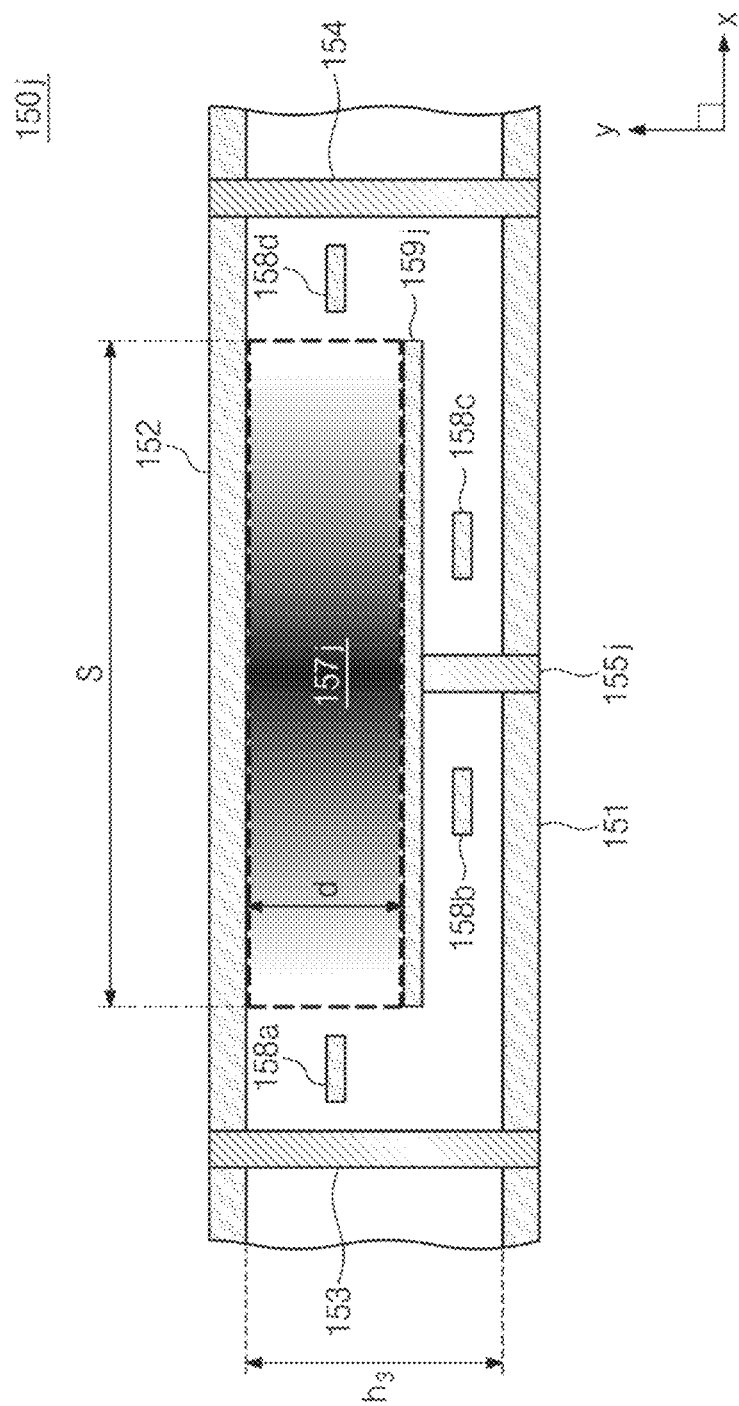
FIG. 22 is a view illustrating positions of strip lines in the multi-mode transmission line of FIG. 20.

FIG. 22 is a view illustrating positions of strip lines in the multi-mode transmission line of FIG. 20. Referring to FIG. 22, the plurality of strip lines 158a, 158b, 158c, and 158d may not be disposed in an electric field focused space 157j corresponding to an area above the upper blind conductor 159j except for an inevitable case. The plurality of strip lines 158a, 158b, 158c, and 158d may be disposed at any positions in the remaining space other than the electric field focused space 157j as much as a given number.

At a time when a signal is transferred to the multi-mode transmission line 150j, a change in the intensity of an electric field generated when the signal is transferred in the electric field focused space 157j is relatively great. Accordingly, it is desired that the plurality of strip lines 158a, 158b, 158c, and 158d are disposed in the remaining area other than the electric field focused space 157j defined by "S×d" of the xy plane. For example, the strip line 158a may be formed on the left of the electric field focused space 157j, and the strip line 158d may be formed on the right of the electric field focused space 157j. The strip line 158b may be formed below a left portion of the electric field focused space 157j, that is, below a left portion of the upper blind conductor 159j. The strip line 158c may be formed below a right portion of the electric field focused space 157j, that is, below a right portion of the upper blind conductor 159j. As the plurality of strip lines 158a, 158b, 158c, and 158d are disposed as described above, the effective shielding between the plurality of strip lines 158a, 158b, 158c, and 158d may be provided.

Figure 23:
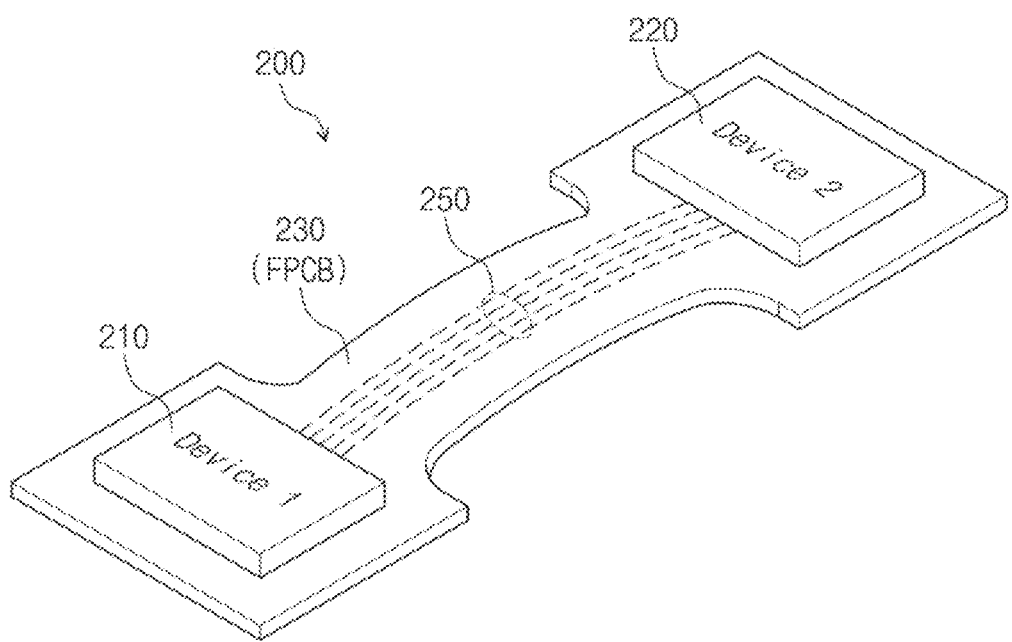
FIG. 23 is a view illustrating another exemplary embodiment.

FIG. 23 is a view illustrating another exemplary embodiment. Referring to FIG. 23, a multi-mode transmission line 250 including the folded substrate integrated waveguide FSIW according to various exemplary embodiment disclosed herein may be applied to a flexible printed circuit board (FPCB) 230 that is provided between devices or systems.

A first device 210 and a second device 220 communicate with each other through the multi-mode transmission line 250 formed in the FPCB 230 that a system 200 includes. That is, it may be difficult to establish an electrical connection between the first device 210 and the second device 220 by using a related art printed circuit board. For the communication between the first device 210 and the second device 220, a wide I/O interface may be implemented through the multi-mode transmission line 250 formed within the FPCB 230. Here, the multi-mode transmission line 250 may have a structure of at least one of the exemplary embodiments described with reference to FIGS. 1 to 22.

In addition, a configuration of an off-chip package such as a PCB, an FPCB, or a silicon interposer is described as an example of a substrate in which a multi-mode transmission line of the exemplary embodiments is formed, but exemplary embodiments are not limited thereto. That is, the multi-mode transmission line may be implemented by a configuration of an on-chip formed on a wafer or on a silicon substrate within one chip.

According to various exemplary embodiments, it may be possible to decrease an operating frequency of the multi-mode transmission line, which uses the substrate integrated waveguide SIW and a strip line, in the TE mode and to effectively block a crosstalk occurring in the TEM mode. Accordingly, it may be possible to effectively implement a wide I/O interface without an increase in the area of a storage device or a system including various semiconductor devices.

While the inventive concept has been described with reference to exemplary embodiments thereof, it will be apparent to those of ordinary skill in the art that various changes and modifications may be made thereto without departing from the spirit and scope set forth in the following claims.

What is claimed is:

1. A multi-mode transmission line comprising:
a first conductive layer;
a second conductive layer formed over the first conductive layer;
a first waveguide wall elongated in a first direction and being in contact with the first conductive layer and the second conductive layer in a vertical direction;
a second waveguide wall elongated in the first direction in parallel to the first waveguide wall and being in contact with the first conductive layer and the second conductive layer in the vertical direction;
at least one strip line formed between the first conductive layer and the second conductive layer and between the first waveguide wall and the second waveguide wall; and
a blind conductor connected to one of the first conductive layer, the second conductive layer, the first waveguide wall, or the second waveguide walk,
wherein the at least one strip line does not form a continuous current path through the at least one strip line to the blind conductor.

2. The multi-mode transmission line of claim 1, wherein the at least one strip line includes a first strip line and a second strip line electrically separated from the first strip line, and
wherein the first strip line and the second strip line are electromagnetically shielded by the blind conductor.

3. The multi-mode transmission line of claim 1, wherein the first waveguide wall passes through the first conductive layer and the second conductive layer and includes a plurality of first through vias arranged in the first direction, and
wherein the second waveguide wall passes through the first conductive layer and the second conductive layer and includes a plurality of second through vias arranged in the first direction.

4. The multi-mode transmission line of claim 3, wherein a first via interval of the plurality of first through vias or a second via interval of the plurality of second through vias is defined to be not greater than $\frac{1}{10}$ of a wavelength of a radio frequency signal propagating within the first conductive layer and the second conductive layer.

5. The multi-mode transmission line of claim 3, wherein the blind conductor includes a plurality of blind vias that pass through one of the first conductive layer or the second conductive layer, and in a first case in which the plurality of blind vias pass through the first conductive layer, the plurality of blind vias are shorter than the plurality of first through vias and in a second case in which the plurality of blind vias pass through the second conductive layer, the plurality of blind vias are shorter than the plurality of second through vias.

6. The multi-mode transmission line of claim 3, wherein the blind conductor is formed of a conductive film connected to one of the first waveguide wall or the second waveguide wall.

7. The multi-mode transmission line of claim 1, wherein the at least one strip line includes a plurality of strip lines electrically separated from each other,
wherein a first strip line and a second strip line of the plurality of strip lines are formed without a shielding, and
wherein each of the first strip line and the second strip line transmits a set of data strobe signals having complementary signal levels.

8. The multi-mode transmission line of claim 1, wherein the at least one strip line includes a plurality of strip lines, and each of the plurality of strip lines transmits a signal corresponding to one of a plurality of channels, and the blind conductor provides a shielding for each of the plurality of channels.

9. A multi-mode transmission line comprising:
a substrate;
a substrate integrated waveguide including a plurality of through vias that are arranged in at least two columns within the substrate, each column forming a waveguide wall, and pass through an upper conductive layer and a lower conductive layer in a vertical direction; and
at least one strip line elongated within the substrate integrated waveguide in a propagation direction of the substrate integrated waveguide,
wherein the substrate integrated waveguide includes the lower conductive layer, the upper conductive layer, and a blind conductor,
wherein the blind conductor is in contact with at least one of the waveguide walls and is elongated to an inside of the substrate integrated waveguide, and wherein the at least one strip line does not form a continuous current path through the at least one strip line to the blind conductor.

10. The multi-mode transmission line of claim 9, wherein the plurality of through vias include:
   a plurality of first through vias passing through the lower conductive layer and the upper conductive layer and arranged in the propagation direction of the substrate integrated waveguide at regular intervals; and
   a plurality of second through vias passing through the lower conductive layer and the upper conductive layer and arranged in the propagation direction in parallel to the plurality of first through vias at the regular intervals.

11. The multi-mode transmission line of claim 10, wherein the blind conductor includes a plurality of blind vias that pass through one of the lower conductive layer or the upper conductive layer and in a first case in which the plurality of blind vias pass through the lower conductive layer, the plurality of blind vias are shorter than the plurality of first through vias and in a second case in which the plurality of blind vias pass through the upper conductive layer, the plurality of blind vias are shorter than the plurality of second through vias.

12. The multi-mode transmission line of claim 11, wherein the plurality of blind vias are arranged in parallel to the plurality of first through vias or the plurality of second through vias at the regular intervals.

13. The multi-mode transmission line of claim 11, wherein the at least one strip line includes a first strip line and a second strip line transmitting different signals, and
   wherein the plurality of blind vias are arranged between the first strip line and the second strip line.

14. The multi-mode transmission line of claim 13, wherein the first strip line and the second strip line are formed in a same metal layer.

15. The multi-mode transmission line of claim 13, wherein the first strip line and the second strip line are formed in different metal layers.

16. The multi-mode transmission line of claim 10, wherein the blind conductor includes a blind conductive film that is penetrated by the plurality of first through vias or by the plurality of second through vias, and in a first case in which the blind conductive film is penetrated by the plurality of first through vias, the blind conductive film is parallel to the lower conductive layer and in a second case in which the blind conductive film is penetrated by the plurality of second through vias, the blind conductive film is parallel to the upper conductive layer.

17. The multi-mode transmission line of claim 16, wherein the blind conductive film is formed between a first strip line and a second strip line that are formed in different metal layers.

18. The multi-mode transmission line of claim 9, wherein the substrate includes at least one of a printed circuit board, a flexible printed circuit board, and a silicon substrate.

19. A storage device comprising:
   a nonvolatile memory device;
   a storage controller configured to communicate with the nonvolatile memory device in a multi-mode; and
   a multi-mode transmission line configured to transmit a signal in the multi-mode between the storage controller and the nonvolatile memory device,
   wherein the multi-mode transmission line includes:
   a substrate integrated waveguide including a plurality of through vias that are arranged in at least two columns, each column forming a waveguide wall, and pass through an upper conductive layer and a lower conductive layer in a vertical direction; and
   at least one strip line elongated within the substrate integrated waveguide in a propagation direction of the substrate integrated waveguide,
   wherein the substrate integrated waveguide includes the lower conductive layer, the upper conductive layer, and a blind conductor,
   wherein the blind conductor is in contact with at least one of the waveguide walls and is elongated to an inside of the substrate integrated waveguide, and
   wherein the at least one strip line does not form a continuous current path through the at least one strip line to the blind conductor.

20. The storage device of claim 19, wherein the plurality of through vias include:
   a plurality of first through vias passing through the lower conductive layer and the upper conductive layer and arranged in the propagation direction of the substrate integrated waveguide at regular intervals; and
   a plurality of second through vias passing through the lower conductive layer and the upper conductive layer and arranged in the propagation direction in parallel to the plurality of first through vias at the regular intervals.

* * * * *